United States Patent

Iizuka

[11] Patent Number: 5,892,611
[45] Date of Patent: Apr. 6, 1999

[54] LASER DRAWING APPARATUS

[75] Inventor: Takashi Iizuka, Tokyo, Japan

[73] Assignee: Asahi Kogaku Kogyo Kabushiki Kaisha, Tokyo, Japan

[21] Appl. No.: 279,748

[22] Filed: Jul. 22, 1994

[30] Foreign Application Priority Data

Aug. 11, 1993 [JP] Japan ................................ 5-199484

[51] Int. Cl.⁶ ................................................ G02B 26/08
[52] U.S. Cl. ........................ 359/204; 359/212; 359/216; 359/629; 347/243
[58] Field of Search ................................ 359/204, 206, 359/212, 214, 216, 217, 218, 618, 629, 639, 640; 347/233, 239, 241, 243, 255

[56] References Cited

U.S. PATENT DOCUMENTS

| | | | |
|---|---|---|---|
| 4,915,465 | 4/1990 | Sugiura | 359/212 |
| 4,975,717 | 12/1990 | Takemoto et al. | 347/239 |
| 5,046,795 | 9/1991 | Morimoto et al. | 359/206 |
| 5,194,981 | 3/1993 | Morimoto | 359/212 |

*Primary Examiner*—Cassandra Spyrou
*Assistant Examiner*—D. E. Schuberg
*Attorney, Agent, or Firm*—Kane,Dalsimer,Sullivan, Kurucz,Levy,Eisele and Richard, LLP

[57] ABSTRACT

A laser drawing apparatus is provided that splits a laser light into a plurality of drawing beams aligned in a common plane. The aligned drawing beams are reflected and deflected through a deflecting mirror to scan a drawing surface. The beams reflected off the mirror are converged through a scanning optical system onto the drawing surface in such a manner that the height of the drawing beams on the drawing surface is in proportion to the deflection angle and a strict relationship exists between the various incident and reflecting angles as well as the focal length of the scanning optical system and pitch of the drawing beams.

11 Claims, 25 Drawing Sheets

LASER DRAWING APPARATUS

BACKGROUND OF THE INVENTION

1. Field of the Invention

The present invention relates to a laser drawing apparatus which is adapted for example to form a predetermined pattern of circuit on a circuit board.

2. Description of the Related Art

In a known method of forming a circuit pattern on a circuit board (i.e., substrate), a photopolymer or the like is uniformly applied to the substrate coated with a thin film layer of electrically conductive metal, such as copper. Thereafter, the substrate is illuminated with ultraviolet light, for example, while masking the substrate with an exposing and printing photomask (photomask film) having a predetermined shape, so that a circuit pattern corresponding to the photomask is formed on the substrate. The exposed photopolymer on the substrate is dissolved by a solvent and is subjected to a predetermined treatment by chemicals in liquid state so that the exposed conductive metal is corroded. No corrosion occurs at the portion of the substrate on which the non-exposed photopolymer layer remains. Hence, the same circuit pattern as the photomask pattern is formed on the substrate.

However, in the known manufacturing method as mentioned above, it requires a long time and a number of processes to examine the indispensable photomask. Furthermore, it is necessary not only to create the environment for the photomask in which the temperature and humidity are kept constant to thereby prevent the photomask from being thermally contracted or expanded, but also to protect the photomask from dust or being damaged, thus resulting in a heavy burden on the maintenance of the photomask.

It is also known to directly draw (expose) the circuit pattern on the substrate, using a scanning laser beam with which the substrate is scanned with the help of a polygonal mirror or the like, without using an exposing and printing photomask. In this method, the above-mentioned drawbacks in the manufacturing method in which the photomask is employed can be eliminated, but there is another problem when the laser beam is reflected by a polygonal mirror or the like and is converged onto the substrate through a lens.

Namely, when the laser beam is scanned through the lens at the meridian thereof, there is no problem, but when the laser beam passes through the portion of the lens other than the meridian thereof, the laser beam emitted from the lens is deviated or bent, thus resulting in a distorted image. The deviation or distortion increases as the distance of the incident point from the meridian increases.

SUMMARY OF THE INVENTION

The primary object of the present invention is to provide a laser drawing apparatus in which no photomask is used; the drawing speed is increased; and the distortion of the drawn image on an drawing surface can be minimized.

To achieve the object mentioned above, according to the present invention, there is provided a laser drawing apparatus includes a splitting means for splitting laser light emitted from a laser source into a plurality of drawing beams, the beams being aligned in a common plane; a deflecting mirror having a reflecting surface which reflects and deflects the aligned drawing beams to scan a drawing surface therewith in a main scanning direction; and a scanning optical system which converges the beams reflected by the reflecting surface of the deflecting mirror onto the drawing surface, wherein the height of the drawing beams on the drawing surface in said main scanning direction from the optical axis of the scanning optical axis is in proportion to the deflection angle $\theta$;

wherein there is the following relationship;

$$\delta = \cos^{-1} \{2 \cos \alpha \times \cos^2 \omega - \cos \alpha\} \gamma = \tan^{-1} \{\sin \alpha / (2 \cos \alpha \times \sin \omega \times \cos \omega)\} (\delta \sin \gamma - \alpha) > p/f$$

wherein "f" designates the focal length of the scanning optical system; "$\alpha$" the incident angle of the drawing beam upon the reflecting surface of the deflecting mirror in a sub-scanning direction normal to the main scanning direction; "$\omega$" the angle of a line normal to the reflecting surface of the deflecting mirror with respect to a bisector of the optical axis of the scanning optical system and the axis of the incident beam; "p" the pitch of the aligned drawing beams; "$\delta$" the angle of the drawing beams reflected by the reflecting surface of the deflecting mirror with respect to the optical axis of the scanning optical system; and, "$\gamma$" the angle of a line connecting an image forming point of the drawing beams reflected by the reflecting surface on the drawing surface and an intersecting point on the optical axis of the scanning optical system to the drawing surface, with respect to the sub-scanning direction.

With this arrangement, no or little distortion of an image drawn by the scanning beams moved by the deflecting mirror occur.

The mirror can comprise of a rotatable polygonal mirror having a plurality of reflecting surfaces, so that when the polygonal mirror rotates, the drawing surface can be scanned with the aligned and split drawing beams reflected by the reflecting surfaces in the main scanning direction of the scanning means.

The angle $\omega$ is defined by the rotational angle of the polygonal mirror, and has a reference point defined by a line which is normal to the deflecting surface of the deflecting mirror and which bisects the angle $\beta$ of the optical axis of the scanning optical system and the incident drawing beams.

The scanning optical system can comprise of an f$\theta$ lens to move the drawing beams at the same drawing speed, wherein the image height of the point image on the drawing surface is in proportion to the deflection angle$\theta$ defined by the optical axis thereof and the reflected beams.

Provision is made of a control means for controlling the acoustooptic modulators in accordance with predetermined control data, so that the emission of the split drawing beams can be independently controlled to provide individual drawing data to the respective drawing beams.

The present disclosure relates to subject matter contained in Japanese patent application No. 5-199484 (filed on Aug. 11, 1993) which is expressly incorporated herein by reference in its entirety.

BRIEF DESCRIPTION OF THE DRAWINGS

The invention will be described below in detail with reference to the accompanying drawings.

DESCRIPTION OF THE PREFERRED EMBODIMENT

Figure 1:
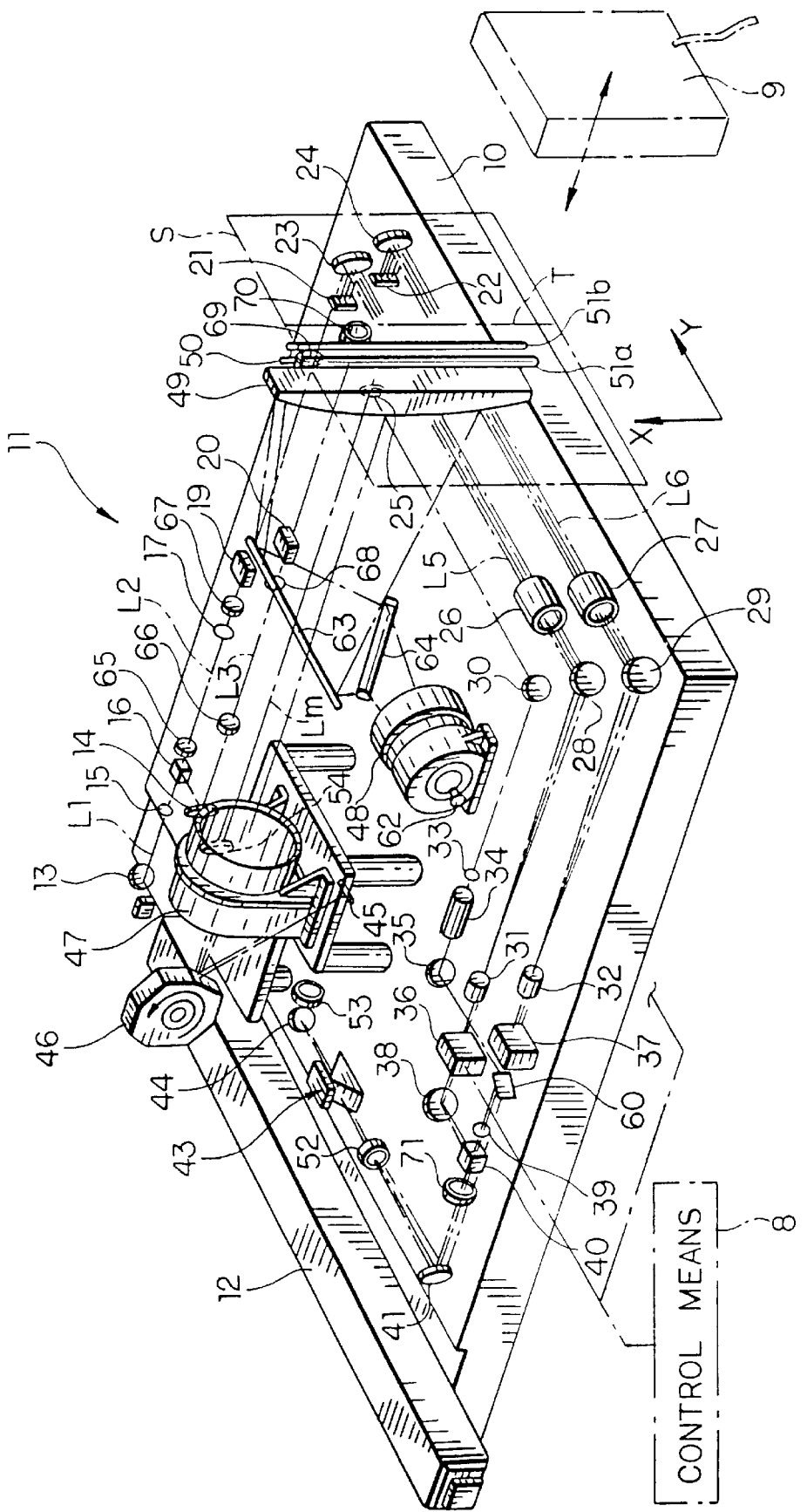
FIG. 1 is a perspective view of a laser drawing apparatus according to the present invention.
Figure 2:
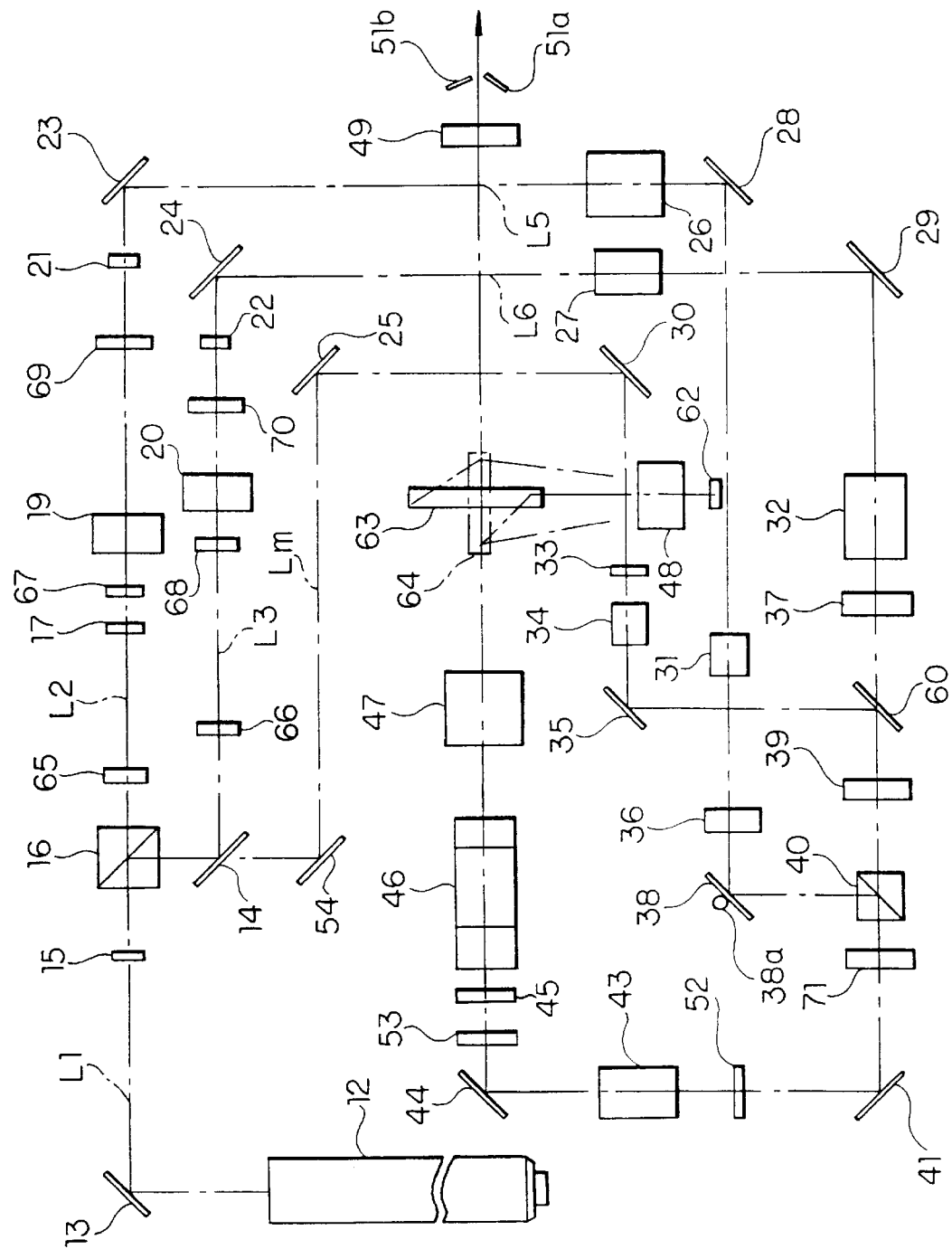
FIG. 2 is a schematic plan view of a laser drawing apparatus shown in FIG. 1.
Figure 3:
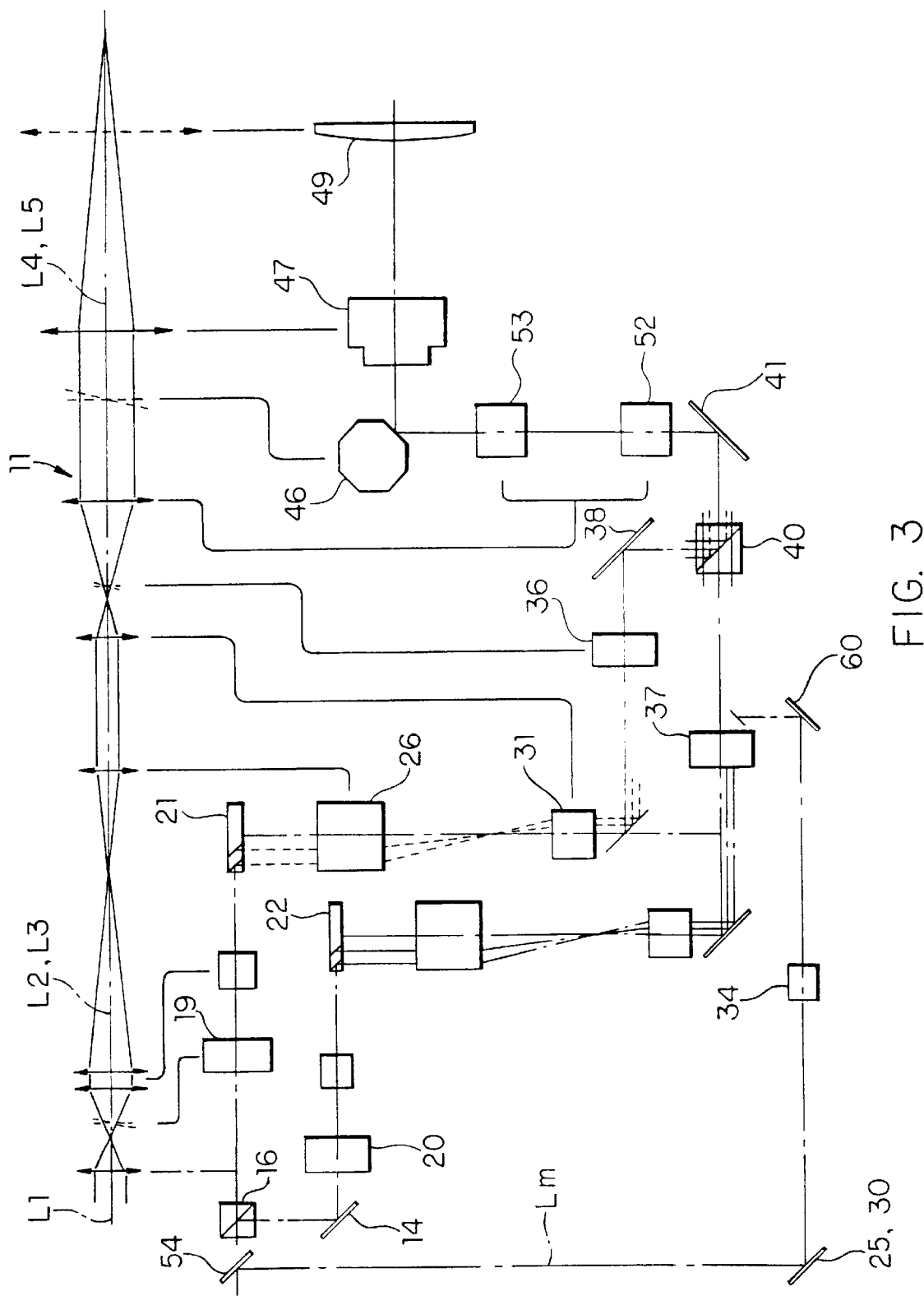
FIG. 3 is a schematic plan view of main components of a laser drawing apparatus shown in FIG. 1.
Figure 4:
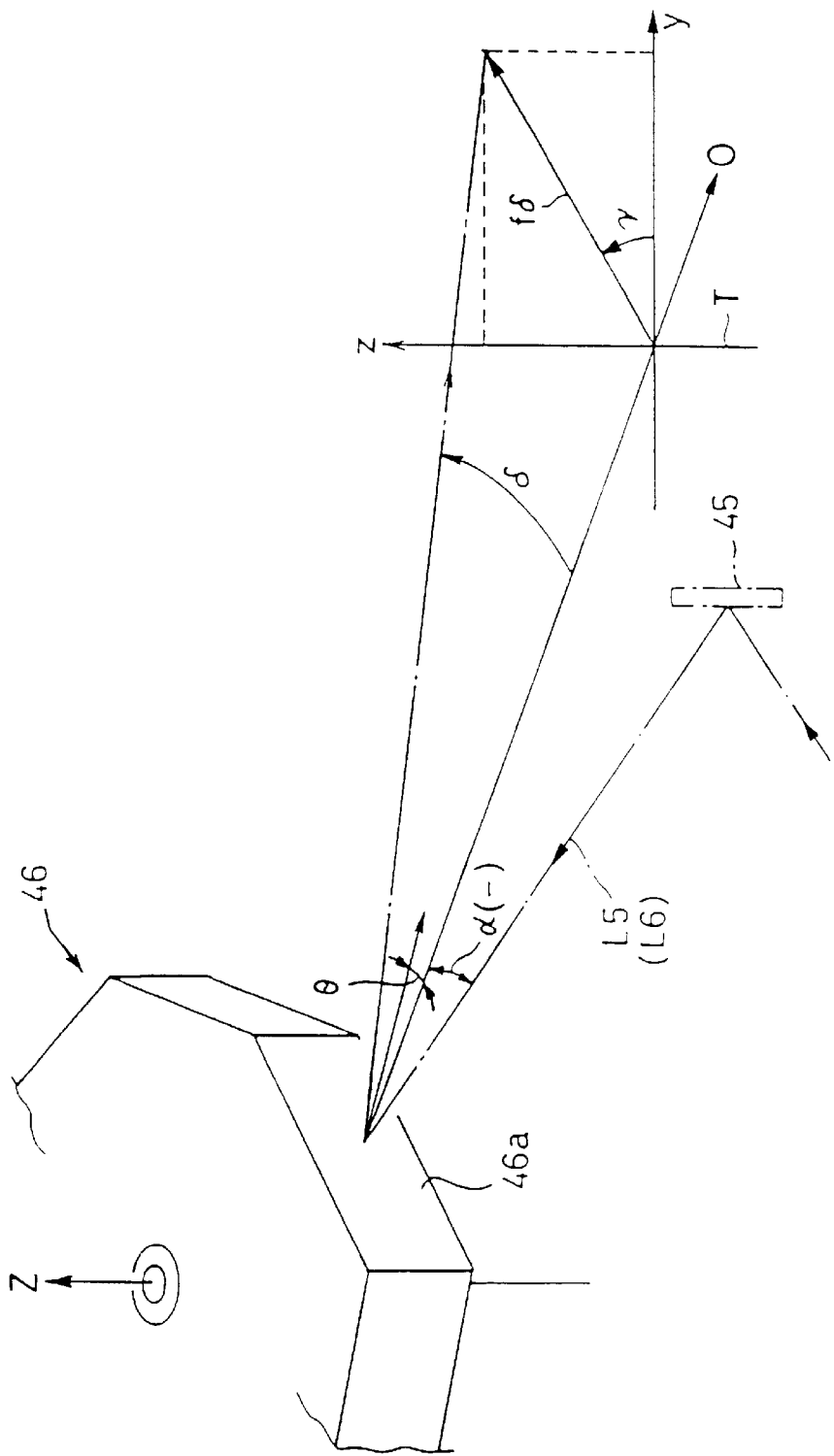
FIGS. 4 through 7 are explanatory views to explain the principle of the scanning operation by a polygonal mirror to draw an image.
Figure 5:
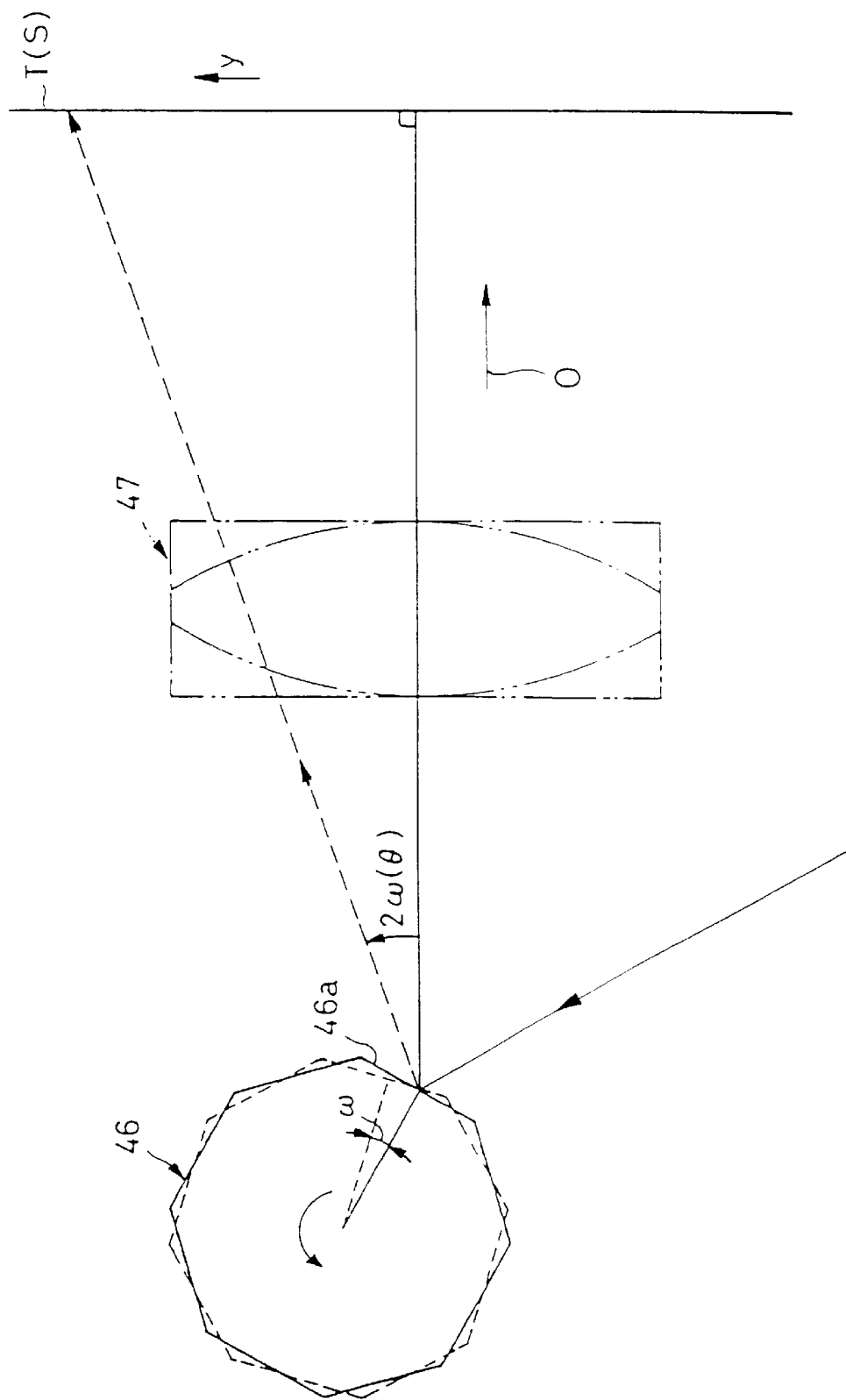
Figure 6:
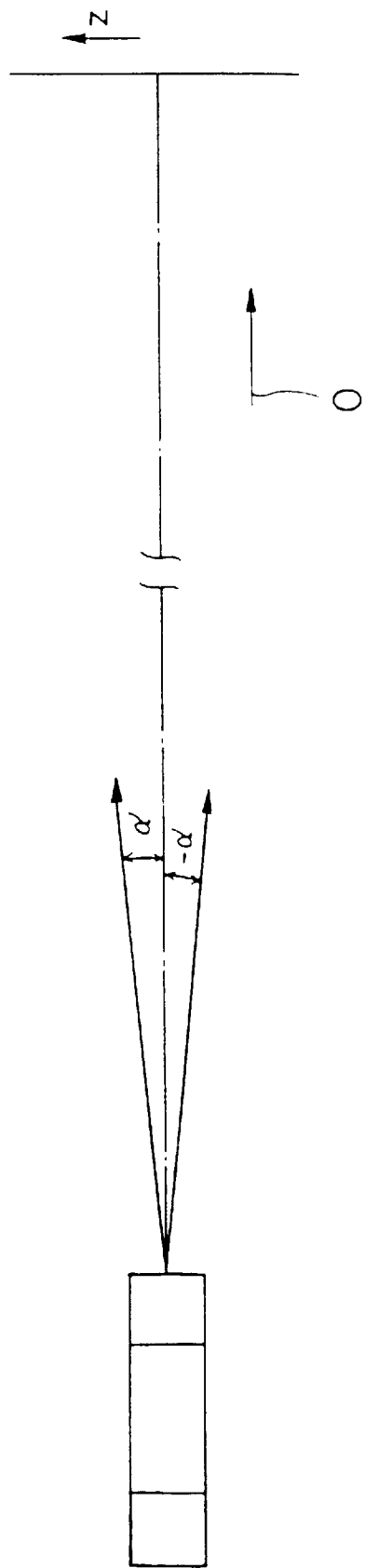
Figure 7:
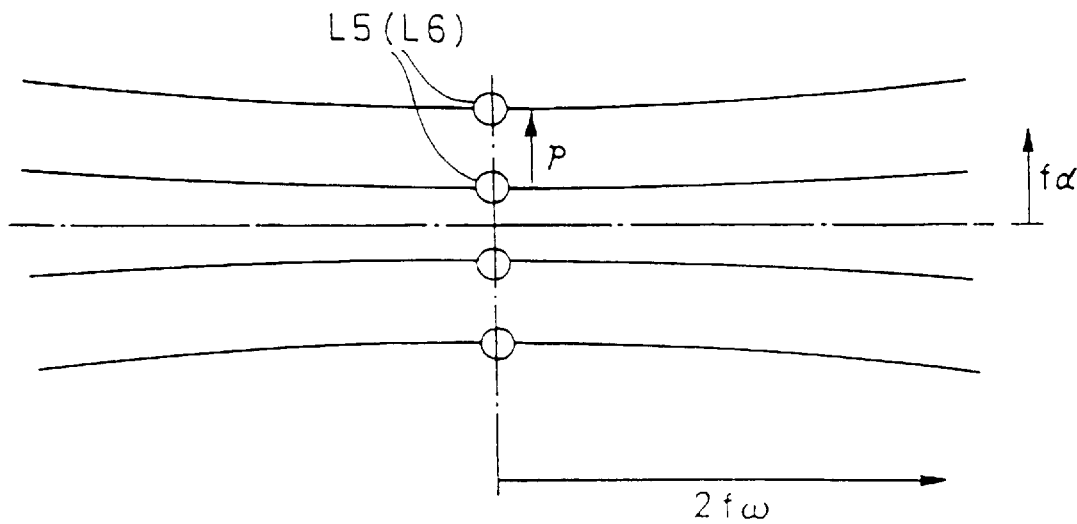

FIGS. 1 and 2 are a perspective view and a schematic plan view of a laser drawing apparatus to which the present invention is applied, respectively, and FIG. 3 is a schematic plan view of main components of a laser drawing apparatus shown in FIGS. 1 and 2.

The laser drawing apparatus 11 includes an argon laser (Ar laser) unit 12, beam benders 13, 23–25, 28–30, 35, 41, 44, 45 and 54, adjusting targets 15, 17 and 33, a half prism 16, a beam bender (half mirror) 14, and lenses 52, 53, 65, 71, on a table 10. The laser drawing apparatus 11 further includes acoustooptic modulators 19 and 20, beam separators 21 and 22, pitch changing convergent optical systems 26, 31, 27 and 32, acoustooptic modulators of 8 channels 36 and 37, a beam bender 38, a condenser optical system 34, a λ/2 plate 39, a polarization beam splitter 40, an image rotator 43, a polygonal mirror 46, an fθ lens 47, a gathering lens 48 for an Y-scale, a condenser lens 49, an Y-scale 50, a mirror 60, monitoring mirrors 51a and 51b, and a photo detector 62 for the Y-scale. The adjusting targets 15, 17 and 33 are reference marks which are adapted to confirm optical paths of groups of beams L2 and L3 and monitoring beam Lm when the Ar laser device 12 is exchanged.

There is a substrate setting device (not shown) in the vicinity of the laser drawing apparatus 11 to form a substrate S on a drawing table surface T (indicated at a two-dotted and dashed line) corresponding to an image surface. The substrate setting device is provided with a Z-table (not shown) which is movable in the Z-direction (i.e., sub-scanning direction of the polygonal mirror 46 corresponding to the transverse direction in FIG. 1) and a swing mechanism (not shown) which swings about a rotational shaft (not shown) in the vertical direction in FIG. 1.

Figure 18:
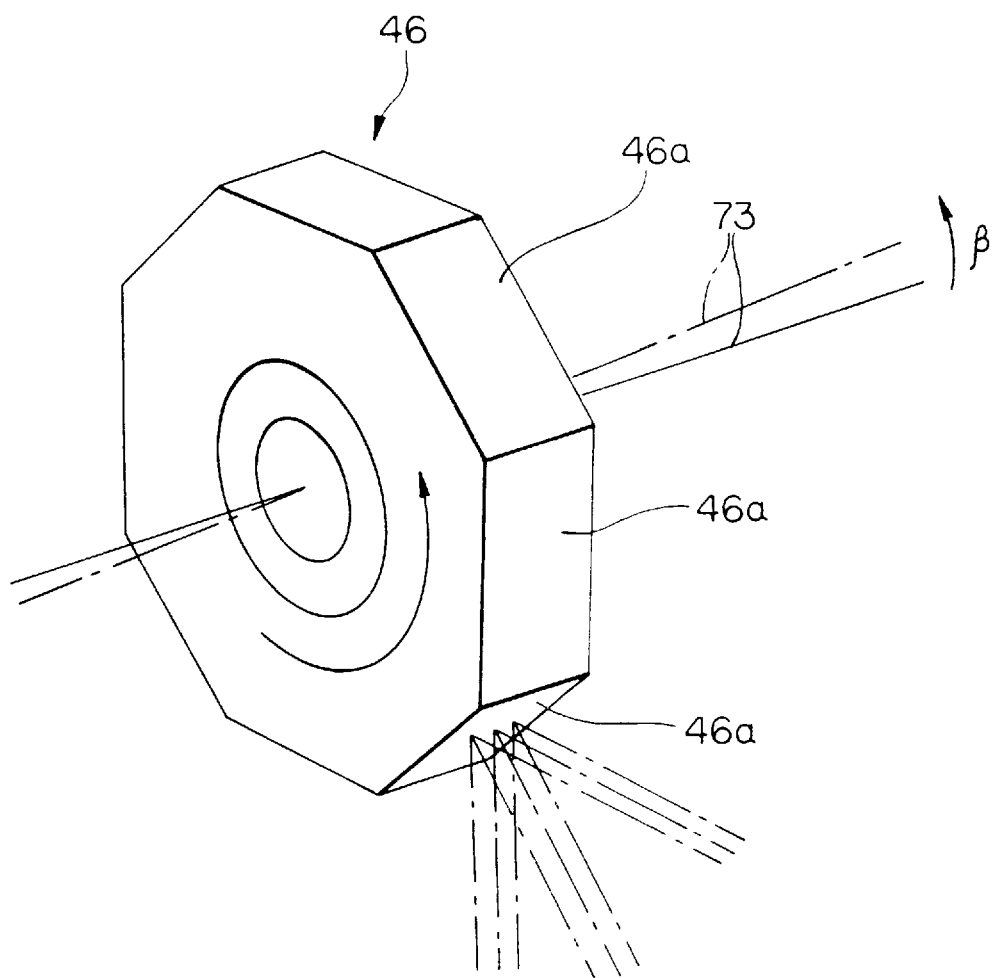
FIG. 18 is an enlarged perspective view of a polygonal mirror.

The Ar laser (i.e., laser source) 12 is a water-cooled type having an output of 1.8 W which emits laser beam L1 whose wavelength is 488 nm. The acoustooptic modulators 19 and 20 adjust the quantity of beams L2 and L3 which are split by the half prism 16, so that the quantities of the beams L2 and L3 are identical. The acoustooptic modulators 19 and 20 also carry out the fine adjustment of the inclination of the reflecting surfaces 46a (FIG. 18) of the polygonal mirror (i.e., scanning optical system) 46 in accordance with data on the inclination of each reflecting surface 46a, stored in a memory (not shown) of a control means 8. To prevent the acoustooptic modulators 19 and 20 from being broken due to an excess quantity of light received thereby, the slit beams L2 and L3 which are obtained by splitting the laser beam L1 are made incident upon the acoustooptic modulators 19 and 20.

Figure 12:
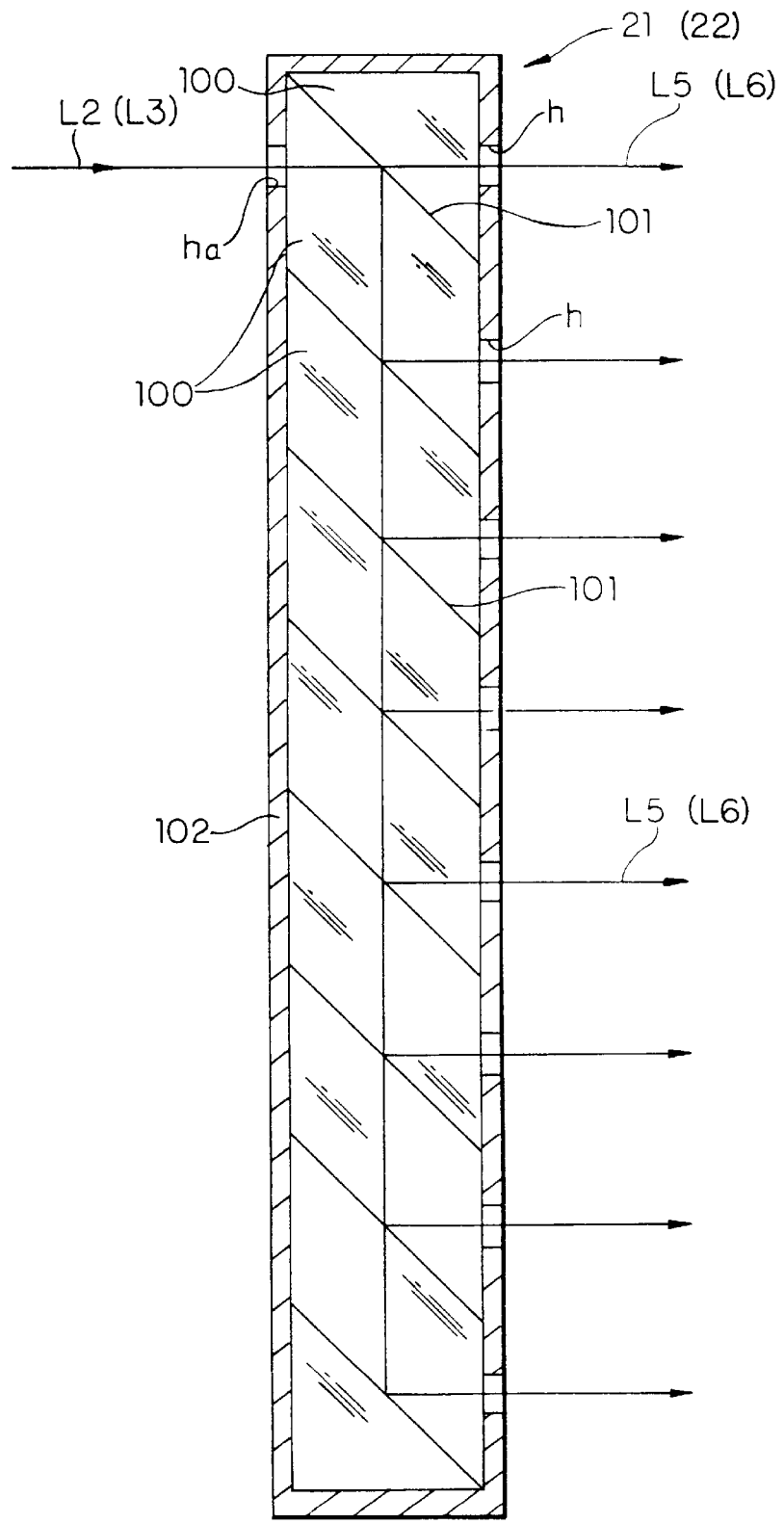
FIG. 12 is a sectional view of a beam separator shown in FIG. 1.

The beams L2 and L3 emitted from the acoustooptic modulators 19 and 20 are made incident upon the beam separators 21 and 22 in which the beams L2 and L3 are respectively split into 8 first drawing beams L5 and 8 second drawing beams L6. As can be seen in FIG. 12, the beam separators 21 and 22 are respectively provided with 8 emission holes "h" aligned in the longitudinal direction (i.e., vertical direction in FIG. 12). The beam separators 21 and 22 are swingably supported by the swing adjusting mechanism 79 (FIG. 10) to rotate in the direction indicated at an arrow A (i.e., direction perpendicular to the optical path of the first and second beams L5 and L6) about respective pivot shafts coaxial to the respective uppermost emission holes "h".

The beam separators 21 and 22 are respectively made of a plurality of optical elements 100 in the form of a plate, which are adhered to each other by an adhesive separating surfaces 101; then cut at an angle of 45° with respect to the separating surfaces; and thereafter enclosed by and in frames 102. The separating surfaces 101 partly reflect and partly transmit therethrough the beams L2 and L3 incident upon uppermost incident holes "ha" formed on the rear surfaces of the beam separators 21 and 22 to obtain groups of beams (first and second drawing beams L5 and L6) spaced at a predetermined distance.

Figure 10:
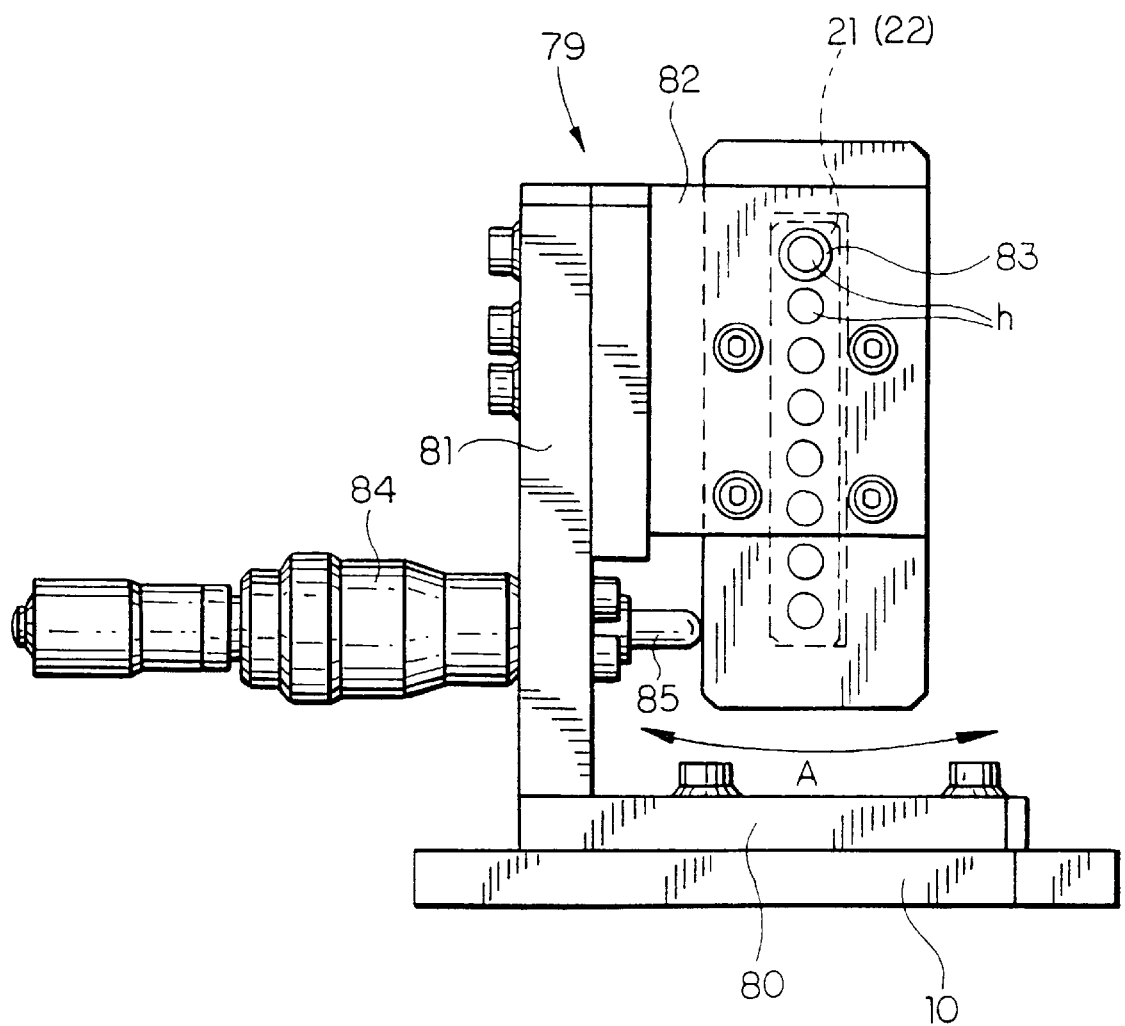
FIG. 10 is a front elevational view of a swing adjusting mechanism which rotates a beam separator.
Figure 11:
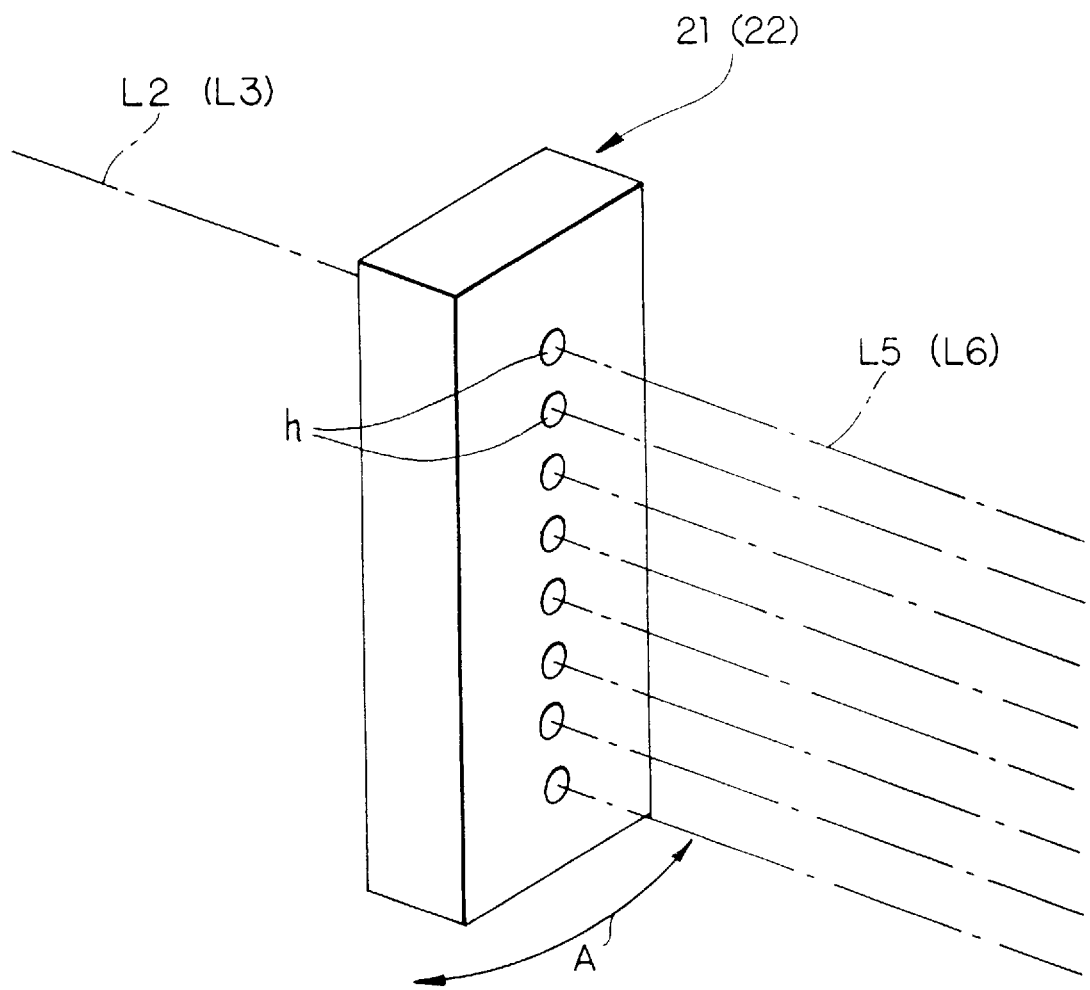
FIG. 11 is an enlarged perspective view of a beam separator in a laser drawing apparatus shown in FIG. 1.
Figure 19:
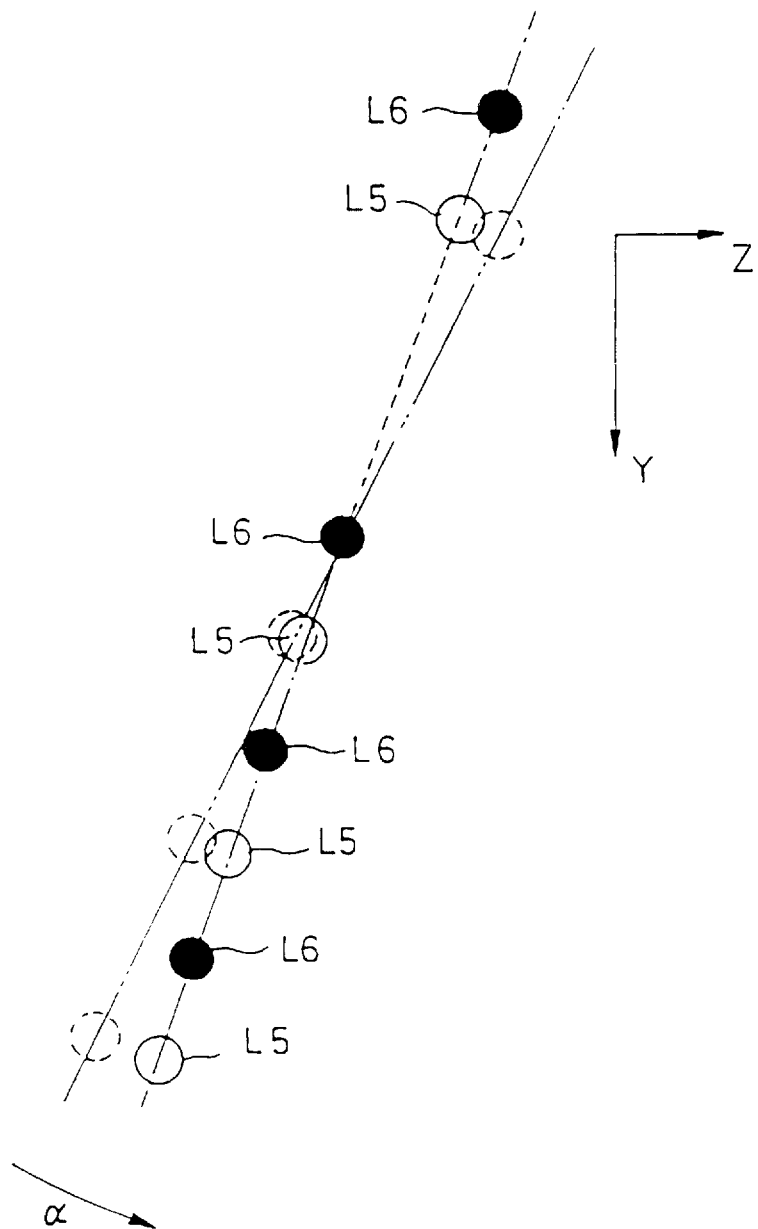
FIG. 19 is an explanatory view of two rows (i.e., groups) of drawing beams which are rotated.

The swing adjusting mechanism 79 includes a base portion 80 secured on the table 10 of the laser drawing apparatus 11, an upright supporting wall 81 projecting upward from the base portion 80, and a bracket 82 which extends at the upper end of the supporting wall 81 in parallel with the base portion 80, as shown in FIG. 10. The supporting wall 81 is provided with a micrometer head 84 which extends in the lateral direction in FIG. 10 (i.e., Z-direction in FIG. 1). The bracket 82 is provided with a pivot shaft 83 coaxial to the uppermost emission hole "h" of the beam separator 21 (22). The beam separator 21 (22) is rotatably biased in the clockwise direction in FIG. 10 about the pivot shaft 83 by a biasing means (not shown). A spindle 85 of the micrometer head 84 abuts at the front end thereof against the lower end of the beam separator 21 (22), so that when the spindle 85 is reciprocally moved in the longitudinal axial direction thereof by the micrometer head 84, the swing movement of the beam separator 21 (22) about the pivot shaft 83 in the direction "A" takes place to rotate the aligned drawing beams L5 (L6) about the axis of the pivot shaft 83 (FIG. 19) to thereby make the drawing beams L5 and L6 parallel to each other.

The group of first drawing beams L5 emitted from the beam separator 21 is made incident upon a pair of pitch changing convergent optical systems 26 and 31. The group of second drawing beams L6 emitted from the beam separator 22 is made incident upon a pair of pitch changing convergent optical systems 27 and 32. The pitch changing convergent optical systems 26, 31 and 27, 32 change the pitches of the 8 first drawing beams L5 and the 8 second drawing beams L6, split by the beam separators 21 and 22, so that the respective pitches correspond to the pitches of the 8 channel acoustooptic modulators 36 and 37.

Figure 20:
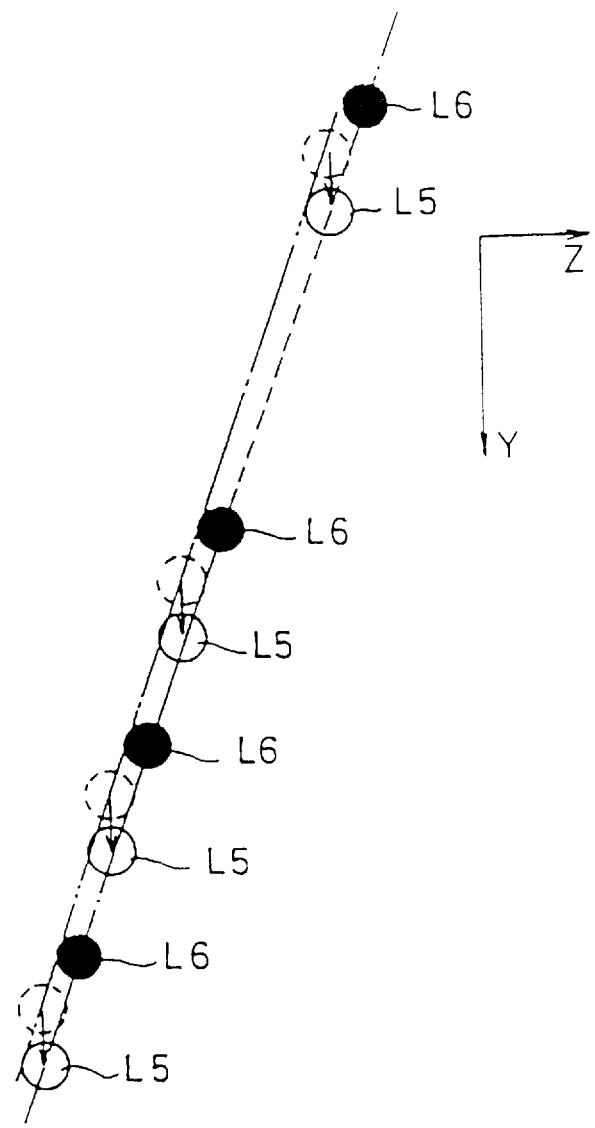
FIG. 20 is an explanatory view of one of the two rows of drawing beams which is translated in a main scanning direction of the polygonal mirror.

The pitch changing convergent optical systems 26 and 31 are moved and adjusted in the Y-direction (FIGS. 1, 13 and 14) by the Y-direction adjusting mechanism 91 (FIG. 13) to move the first group L5 of aligned drawing beams toward the second group L6 of aligned drawing beams (FIG. 20). Thus, the pitch changing convergent optical systems 26 and 31 constitute an Y-direction adjusting means to adjust the deviation of the group of beams in the direction Y.

Figure 13:
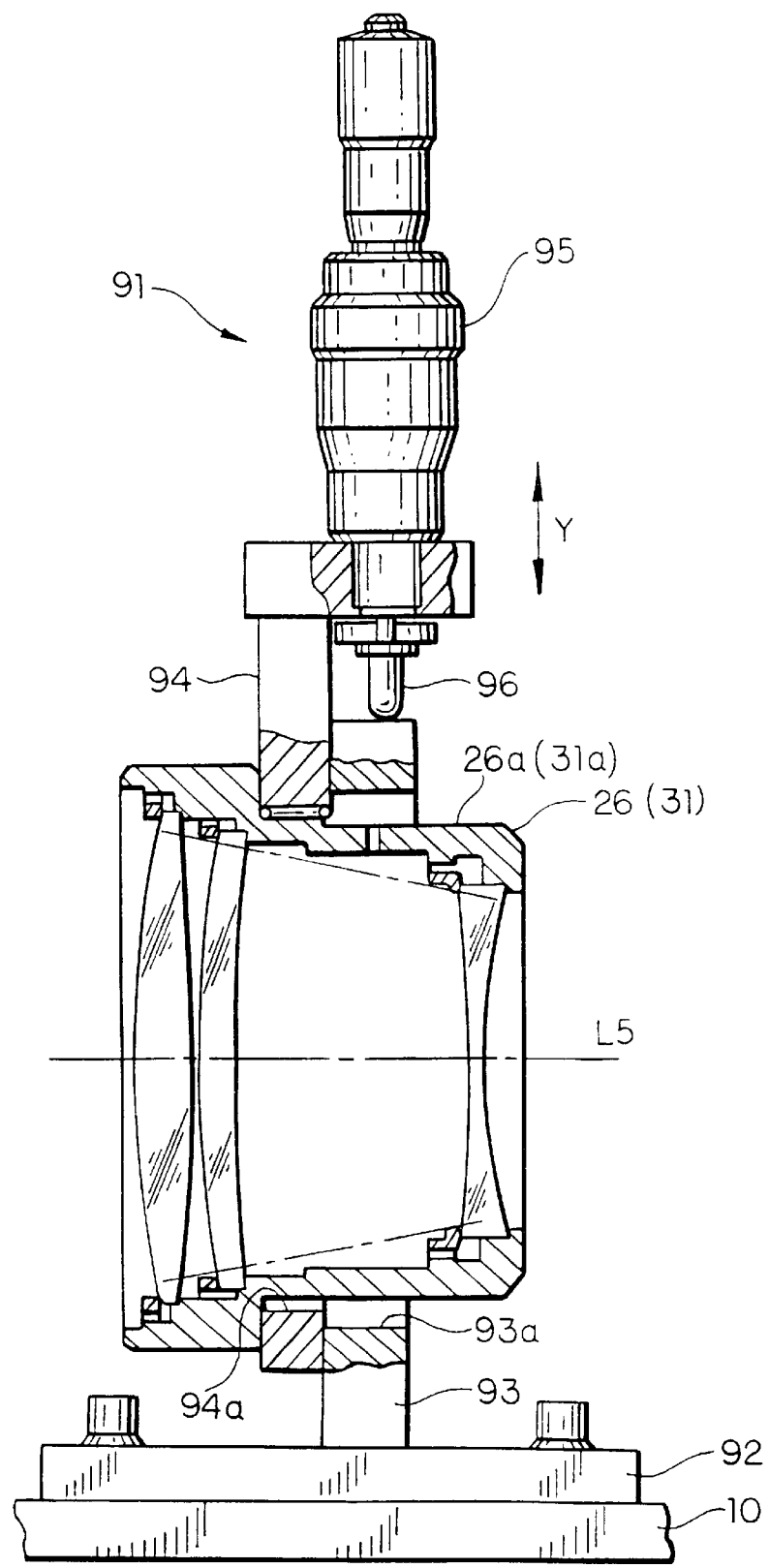
FIG. 13 is a sectional side view of an adjusting mechanism in an Y-axis direction (Y-direction adjusting mechanism)
Figure 14:
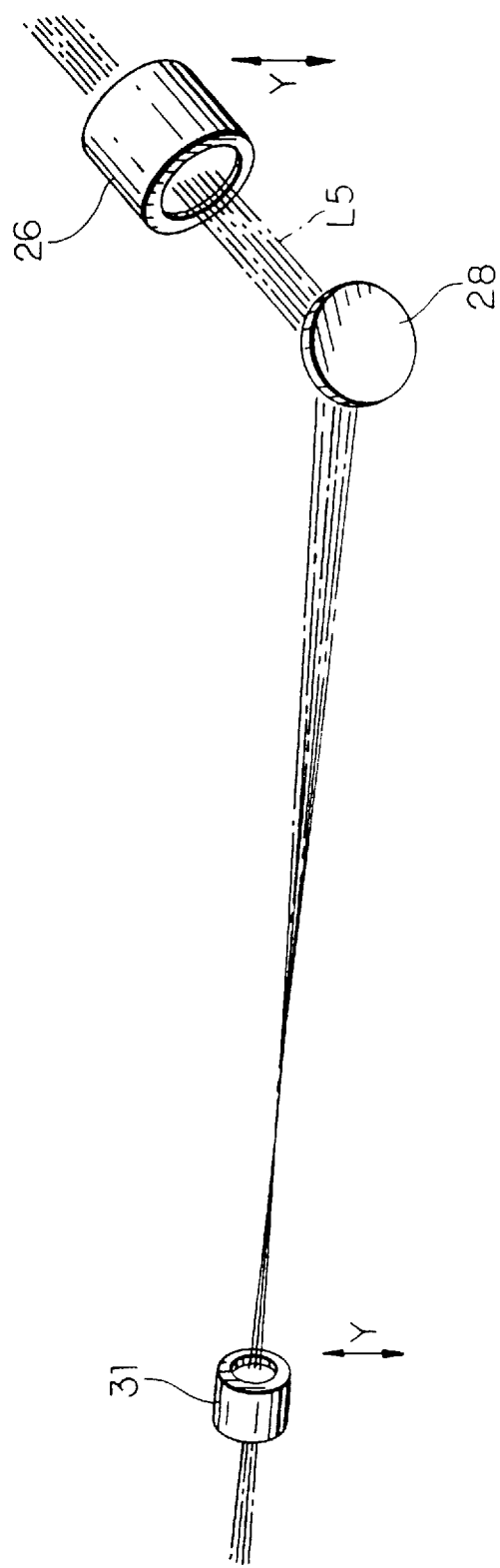
FIG. 14 is a perspective view of a pitch changing convergent optical system which constitutes the Y-direction adjusting mechanism.

The Y-direction adjusting mechanism 91 includes a stationary supporting wall 93 which projects upward from the base portion 92, and a movable supporting wall 94 which is movable in the vertical direction (i.e., direction Y) in FIG. 13. The micrometer head 95 is mounted to the upper portion of the movable supporting wall 94 extending in the vertical direction. The movable supporting wall 94 is provided with a supporting hole 94a extending therethrough, in which the pitch changing convergent optical system 26 (31) is secured. The stationary supporting wall 93 is provided with a hole 93a in which an annular portion 26a (31a) of the pitch changing convergent optical system 26 (31) is movably inserted.

Figure 15:
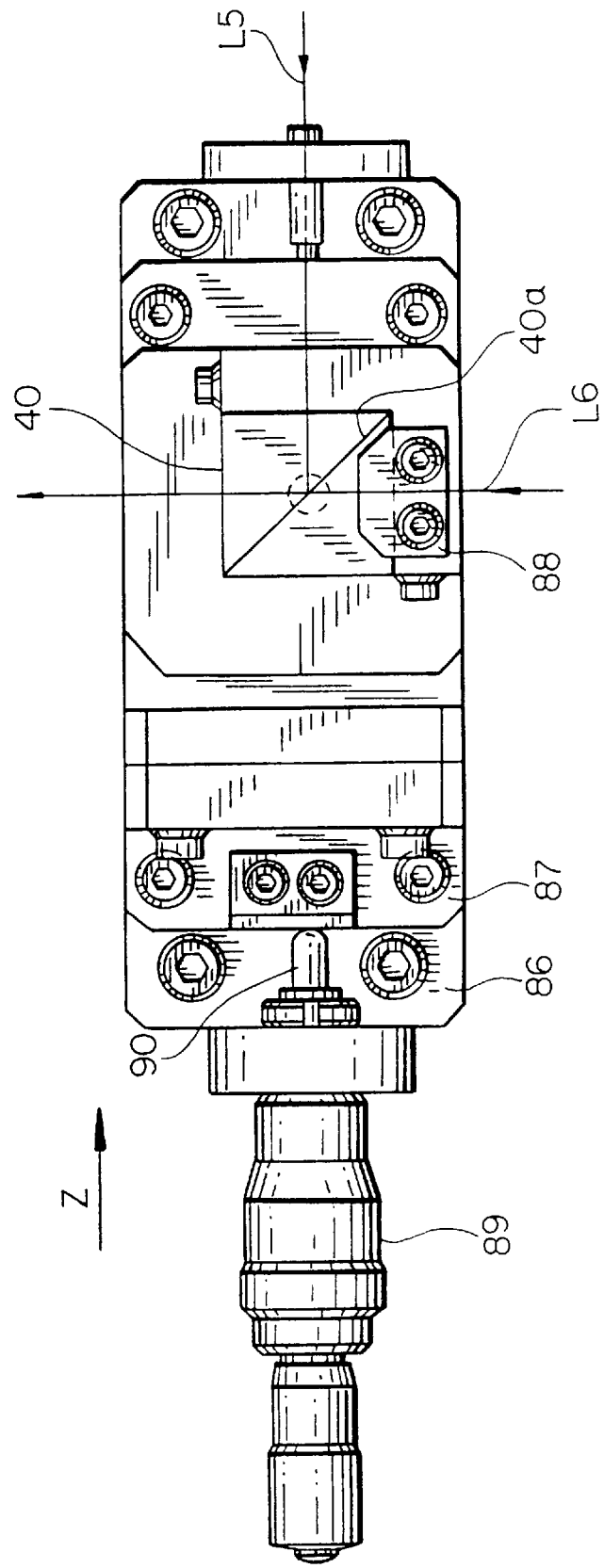
FIG. 15 is a plan view of an adjusting mechanism in a Z-axis direction (Z-direction adjusting mechanism)
Figure 21:
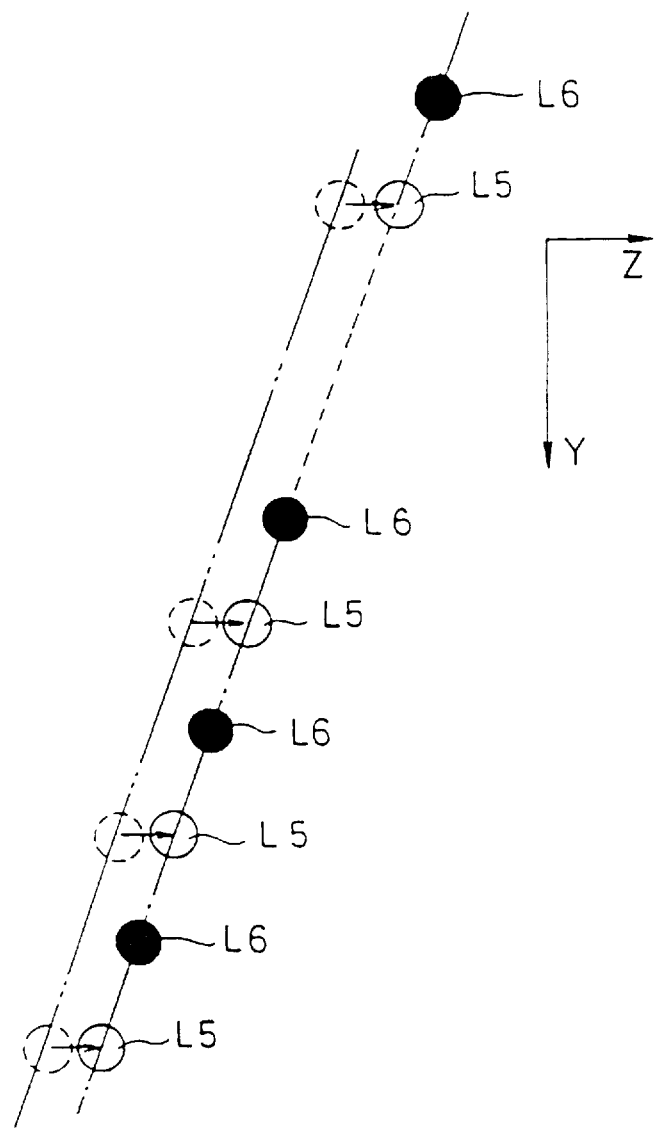
FIG. 21 is an explanatory view of one of the two rows of drawing beams which is translated in a sub-scanning direction of the polygonal mirror.

The hole 93a has a diameter larger than the diameter of the annular portion 26a (31a) so as to permit the latter to move therein through the movable supporting wall 94. The movable supporting wall 94 is biased by a biasing means (not shown) in the vertical direction to bias the pitch changing convergent optical system 26 (31) and the micrometer head 95 in the same direction. Consequently, the spindle 96 of the micrometer head 95 is pressed at the front end thereof against the upper portion of the stationary supporting wall 93. With the arrangement of the Y-direction adjusting mechanism 91 as constructed above, the pitch changing convergent optical system 26 (31) can be slid and adjusted in the vertical direction (Y-direction) through the movable supporting wall 94 when the spindle 96 is reciprocally moved by the micrometer head 95. 40 which constitute a Z-direction adjusting means are moved to move the first drawing beams L5 in the direction Z, i.e., toward the second drawing beams L6 (FIG. 21), to thereby adjust the positional relationship therebetween. The beam bender 38 is rotated about the pivot shaft 38a (FIG. 2) extending in the direction Y to move and adjust the first drawing beams L5 in the direction Z. The polarization beam splitter 40 is supported by the Z-axis adjusting mechanism 85 (FIG. 15) so as to move in the direction Z.

Figure 16:
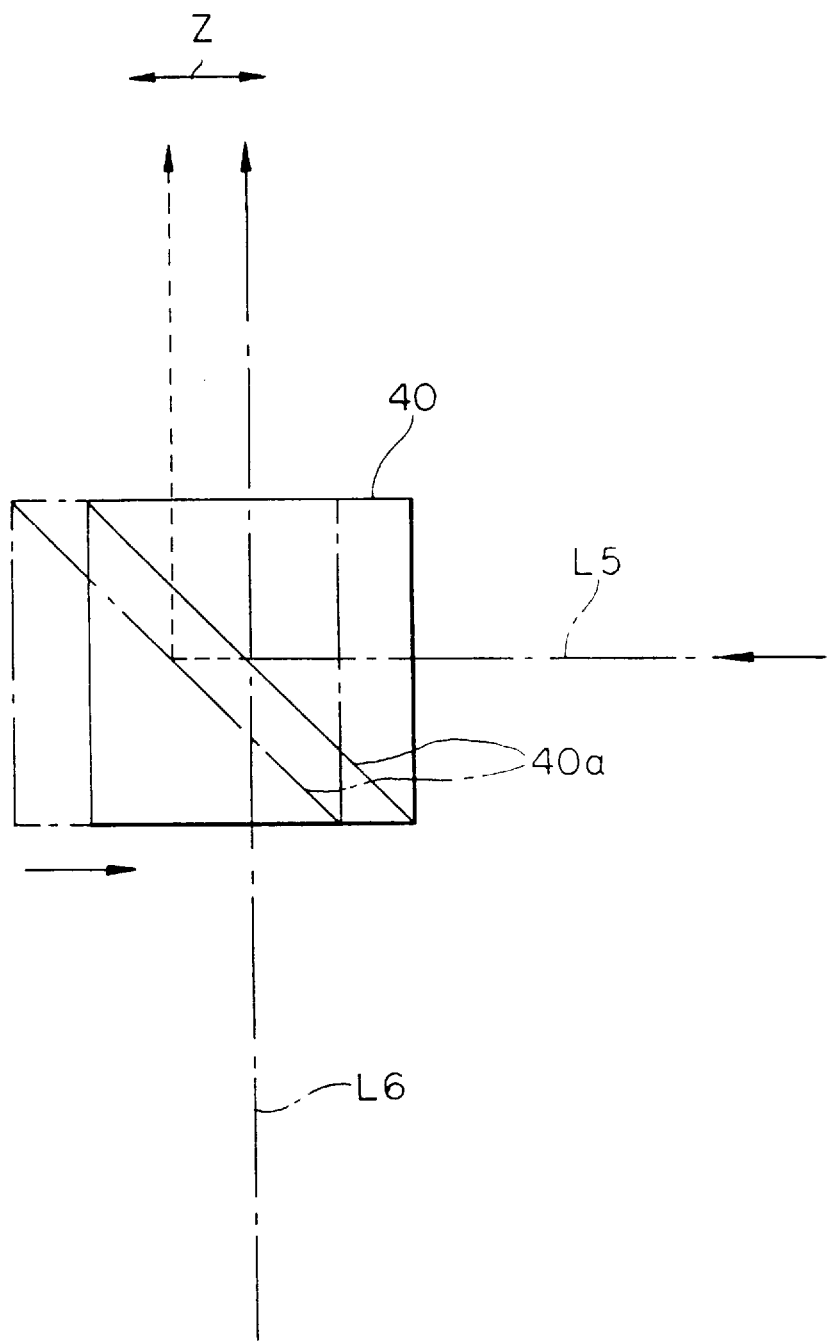
FIG. 16 is a plan view of a polarization beam splitter which is slid in the Z-axis direction by the Z-direction adjusting mechanism.

The Z-direction adjusting mechanism 85 includes a base portion 86 secured to the table 10 of the laser drawing apparatus 11, a movable portion 87 capable of moving in the direction Z with respect to the base portion 86, and a micrometer head 89 which is supported by the base portion 86 to extend in the direction Z. The polarization beam splitter 40 is secured to the movable portion 87, so that the half mirror surface 40a of the polarization beam splitter 40 is inclined at an angle of 45° with respect to the direction Z. The movable portion 87 is biased by a biasing means (not shown) toward the micrometer head 89 (i.e., the left direction in FIG. 15), so that one side surface thereof is pressed against the front end of the spindle 90 of the micrometer head 89. Consequently, when the spindle 90 is moved in the longitudinal direction thereof by the operation of the micrometer head 89, the polarization beam splitter 40 is moved in the direction Z to move and adjust the first drawing beams L5 in the direction Z (FIG. 16).

The polarization beam splitter 40 constitutes a beam combining means to alternately align the first group L5 of the aligned drawing beams deflected by the beam bender 38 and the second group L6 of the aligned drawing beams transmitted through the λ/2 plate 39 at a predetermined pitch in the direction Y. The direction of polarization of the first drawing beams L5 is not changed, while the direction of polarization of the second drawing beams L6 is changed by 90° with respect to the direction of polarization of the first drawing beams L5 through the λ/2 plate 39. Hence, the drawing beams L5 and L6 having a difference of 90° in the direction of polarization are combined by the polarization beam splitter 40 to be alternately aligned along one line in the direction Y.

The acoustooptic modulators 36 and 37 are each made of a crystal of tellurium dioxide or the like, which exhibits an acoustooptic effect that the refractive index of the crystal is slightly changed when an ultrasonic wave is applied to the crystal. The acoustooptic modulators 36 and 37 generate a traveling-wave shape of ultrasonic wave within the crystal to thereby diffract the laser beam at a Bragg angle, when a high frequency electric field is applied to transducers provided at the opposed ends of the crystal. When no high frequency electric field is applied to the transducers, the laser beam incident upon the crystal is transmitted through the acoustooptic modulators. Consequently, the ON-OFF control of the emission of the incident beams, i.e., the drawing beams L5 and L6 can be optionally and easily carried out by switching the application of the high frequency electric field to the acoustooptic modulators 36 and 37. Each of the acoustooptic modulators 36 and 37 has 8 channels aligned along a line so as to receive the aligned drawing beams L5 (L6) and modulate the incident beams in the transverse direction (direction Z in FIG. 1).

The acoustooptic modulators 36 and 37 function to eliminate the difference in the quantity of light between the 8 first drawing beams L5 and the 8 second drawing beams L6. The acoustooptic modulators 36 and 37 also function to independently control the emission of the drawing beams L5 and L6 split by the beam separators 21 and 22 through the control means 8 in accordance with predetermined data to thereby provide independent ON-OFF drawing data to the first and second drawing beams L5 and L6. These functions will be discussed hereinafter.

The fθ lens 47 is adapted to realize an identical drawing speed of the drawing beams with which the drawing surface is scanned using the polygonal mirror 46. The fθ lens 47 contributes to an elimination of the problem that the position of the point image of the drawing beams on the scanning surface of the table surface T (FIG. 1) is not proportional to the deflection angle θ but is scanned at a higher scanning speed determined by tanθ at the upper portion of the scanning surface. The fθ lens 47 is comprised of a plurality of convex and concave lenses, wherein the image height of the point image on the scanning surface is proportional to the deflection angle θ defined by the reflected light and the optical axis of the fθ lens, so that the drawing beams can be moved (scanned) at an equal scanning speed.

Figure 26:
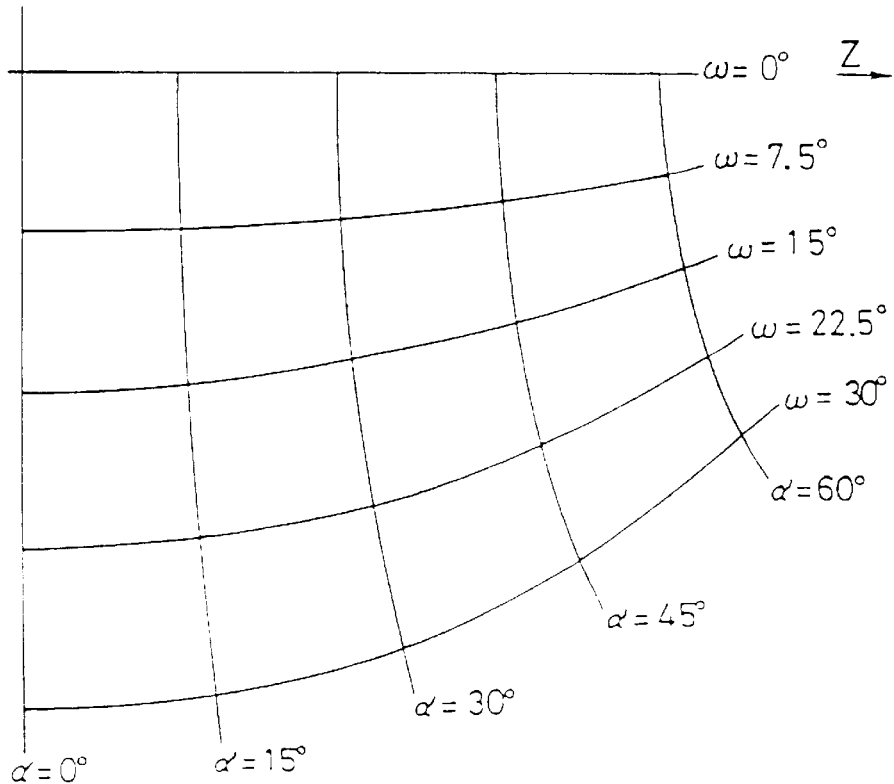
Figure 27:
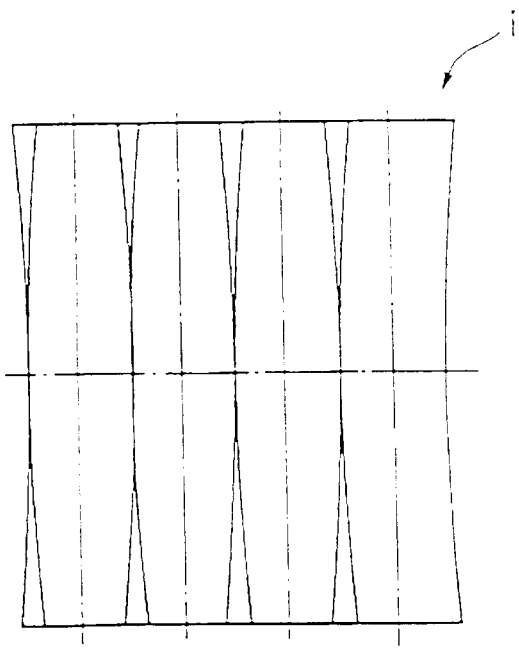

Consequently, it is possible to scan the object with the drawing beams at the same speed, but there is the following problem. Namely, since the drawing beams reflected by the polygonal mirror 46 are aligned in the sub-scanning direction (direction Z) of the polygonal 15 mirror 46 during the scanning, as shown in FIG. 26, the distance of the position at which the drawing beams are transmitted through the fθ lens 47 from the optical axis thereof increases as the height of the drawing beams in the sub-scanning direction increases, so that the drawn image "i" (FIG. 27) can be distorted.

To solve this problem, the improvement of the laser drawing apparatus 11 according to the present invention is as follows.

Namely, there is the following relationship defined by formula (1);

$y = f \times \delta \cos\gamma$ $z = f \times \delta \sin\gamma$ $\delta = \cos^{-1}\{2\cos\alpha \times \cos^2\omega - \cos\alpha\}$ $\gamma = \tan^{-1}\{\sin\alpha/(2\cos\alpha \times \sin\omega \times \cos\omega)\}$ (1) $(\delta \sin\gamma - \alpha) < p/f$ wherein "f" designates the focal length of the f θ lens 47; "y" the image height in the main scanning direction(Y) in the polygonal mirror 46; "z" the image height in the sub-scanning direction (Z) in the polygonal mirror 46; "α" the incident angle of the drawing beam upon the reflecting surface 46a of the polygonal mirror 46 in a sub-scanning direction (Z) normal to the main scanning direction (Y); "ω" the angle of the line "m" normal to the reflecting surface 46a of the polygonal mirror 46 with respect to a bisector of the optical axis O of the fθ lens 47 and the axis O of the incident beam; "p" (FIG. 7) the pitch of the aligned drawing beams L5 and L6; "δ" the angle of the drawing beams L5 and L6 reflected by the reflecting surface 46a of the polygonal mirror 46 with respect to the optical axis O of the f θ lens 47; and "γ" the angle of a line connecting an image forming point of the drawing beams L5 and L6 reflected by the reflecting surface 46a on the drawing surface and an intersecting point on the optical axis O of the f θ lens 47 to the drawing surface, with respect to the sub-scanning direction Y (FIGS. 4 through 7).

Figure 9:
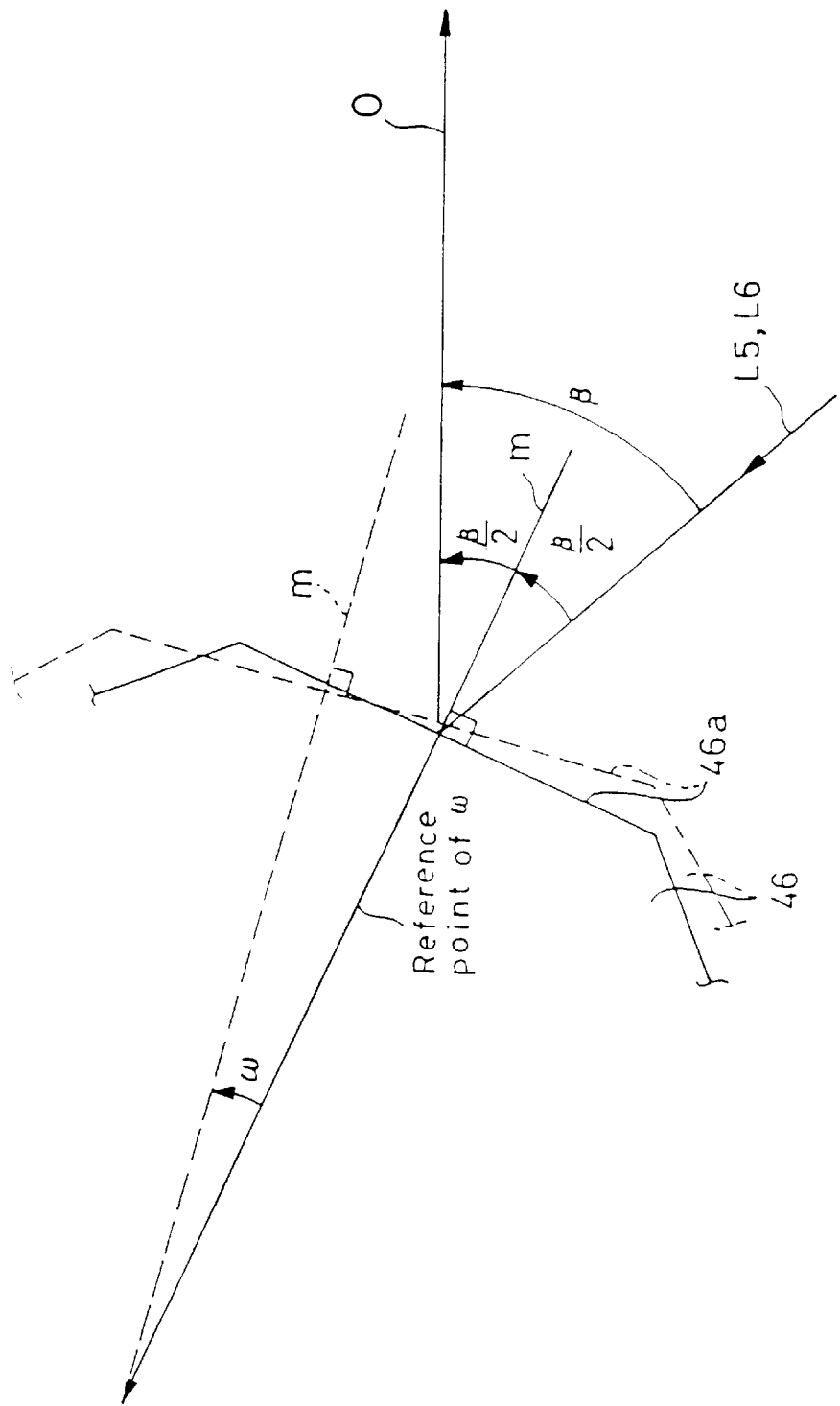
FIG. 9 is an explanatory view to explain the principle of the scanning operation by a polygonal mirror to draw an image.

Note that the angle ω defined by the normal line "m" to the reflecting surface 46a and the optical axis O of the fθ lens 47, i.e., the reference of the rotational angle ω of the polygonal mirror 46 is given when the normal line "m" bisects the angle β defined by the drawing beams (incident beams) L5 and L6 and the optical, axis O of the f θ lens 47, as may be seen in FIG. 9.

Consequently, in the laser drawing apparatus 11 using the polygonal mirror (deflecting mirror) 46 as a scanning means and the fθ lens (scanning optical system) as a beam gathering means of the drawing beams L5 and L6 reflected by the polygonal mirror 46, the deviation of the drawn image "i" in the sub-scanning direction can be made smaller than one pitch "p" (FIG. 7) of the drawing beams.

Figure 8:
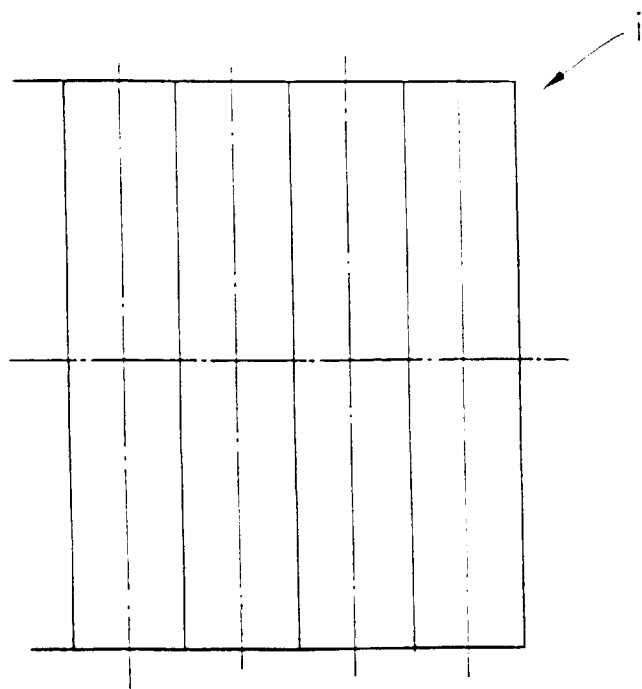
FIG. 8 is an example of a drawn image.

As a part of the the fθ lens 47, which is close to the optical axis O, is used for drawing, i.e., a peripheral part of the lens, which may cause a distortion, is not used for drawing, upon the scanning with the split beams L5 and L6 aligned along a line and reflected by the reflecting surface 46a of the polygonal mirror 46. Accordingly the distortion of the drawn image "i" (FIG. 27) is minimized, so that the high quality image is formed, as shown in FIG. 8. Moreover, as can be understood from the above-mentioned formula, it is preferable that the fθ lens 47 to be used has a large focal length "f" to make the distortion of the drawn image "i" as small as possible.

Although the fθ lens 47 is represented by a single lens in the drawings, the fθ lens is actually made of a plurality of cemented convex and concave lenses, as mentioned above.

The monitoring beam Lm is independent from the beams L2 (L5) and L3 (L6) and has an optical path spaced from the optical paths of the drawing beams L5 and L6 at a predetermined distance. The monitoring beam Lm is deflected by the mirrors 54 and 25 and travels along an optical path spaced from the drawing beams L5 and L6 at a predetermined distance. Thereafter, the monitoring beam Lm is deflected by the mirrors 35 and 60 to come close to the drawing beams L5 and L6. Thereafter, the monitoring beam Lm passes through an optical path juxtaposed directly close to the optical paths of the drawing beams L5 and L6 through the lens 71, the beam bender 41 and the lens 52, etc.

The image rotator 43 is comprised of a mirror system which converges the 16 aligned beams of the drawing beams L5 and L6 onto the substrate S located at the drawing table surface T in a predetermined oblique direction, upon scanning by the polygonal mirror 46. Therefore, although the 16 beams of the first and second drawing beams L5 and L6 are aligned along one line in the main scanning direction (i.e., direction Y) of the polygonal mirror 46 before they are made incident upon the image rotator 43, the 16 beams are rotated with respect to the direction Y in the clockwise direction by a predetermined angle when emitted from the image rotator 43, as can be seen, for example, in FIG. 19.

The first and second drawing beams L5 and L6 and the monitoring beam Lm are deflected by the beam benders 44 and 45 and are thereafter made incident upon the reflecting surfaces 46a of the polygonal mirror 46. When the polygonal mirror 46 rotates about the rotating shaft 73 in the counterclockwise direction in FIG. 18, the deflection angle θ (FIG. 5) varies continuously (i.e., scan) the first and second drawing beams L5 and L6 and the monitoring beam Lm through the reflecting surfaces 46a which rotate in the same direction. Consequently, the first and second drawing beams L5 and L6 are transmitted through the fθ lens 47 and the condenser lens 49, and converged onto the substrate S located at the table surface T. The rotating shaft 73 of the polygonal mirror 46 is supported by a supporting means (not shown) so that the inclination thereof in the sub-scanning direction Z can be displaced by an angle β. Hence, the perpendicularity of the main scanning line with respect to the sub-scanning line in the polygonal mirror 46 can be easily and optionally adjusted.

The monitoring beam Lm transmitted through the fθ lens 47 and the condenser lens 49 together with the first and second drawing beams L5 and L6 is successively reflected by the mirrors 51a and 51b to change the direction thereof by 180° and is made incident upon the Y-scale 50 located at a position equivalent to the image forming surface of the table surface T. The Y-scale 50 is made of a glass plate provided with a slit(s) to function as a linear encoder. The monitoring beam Lm transmitted through the Y-scale 50 is reflected and converged by elongated mirrors 63 and 64, and is then converged by the condenser lens 48 for the Y-scale to be made incident upon the photo-detector 62 for the Y-scale. When the positions of the 16 beams of the first and second drawing beams L5 and L6 are detected in accordance with the position of the monitoring beam Lm detected by the photo-detector 62, the control signal is sent from the control means 8 (e.g.,micro computer) in accordance with the detection data thus obtained. Consequently, the 16 beams of the first and second drawing beams L5 and L6 are independently controlled (i.e., turned ON and OFF) in accordance with the control signal.

Figure 24:
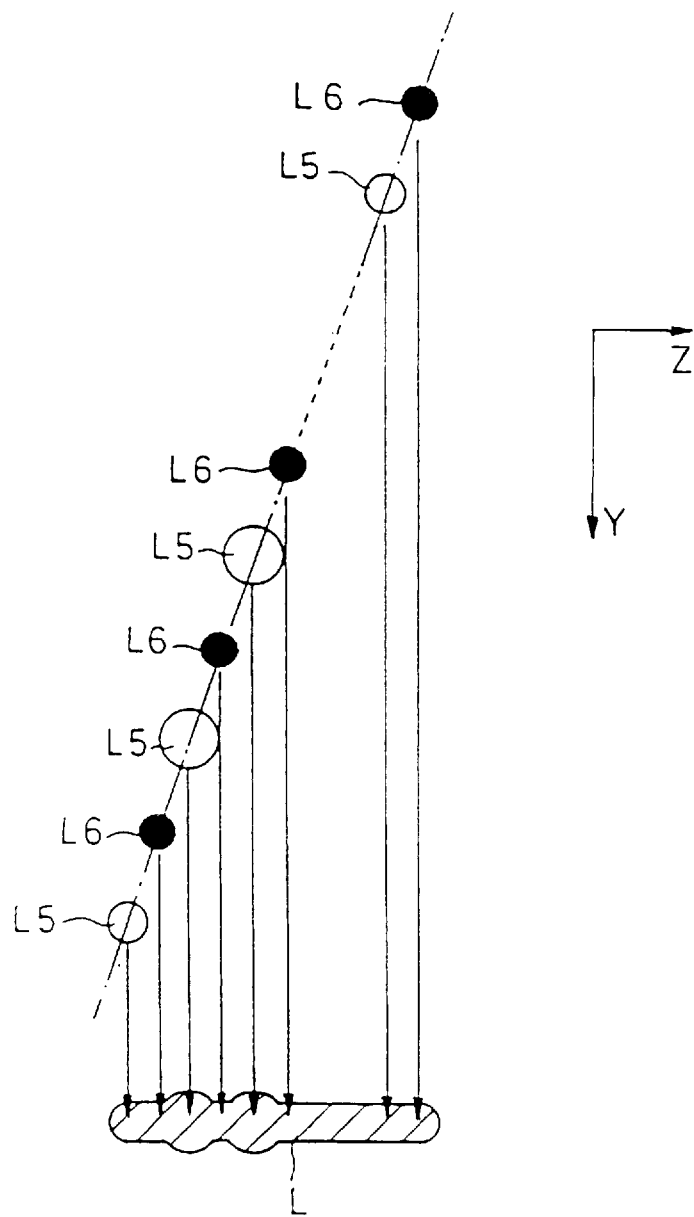
FIG. 24 is an explanatory view of a row of drawing beams and a line drawn by the drawing beams, before an amendment is carried out.
Figure 25:
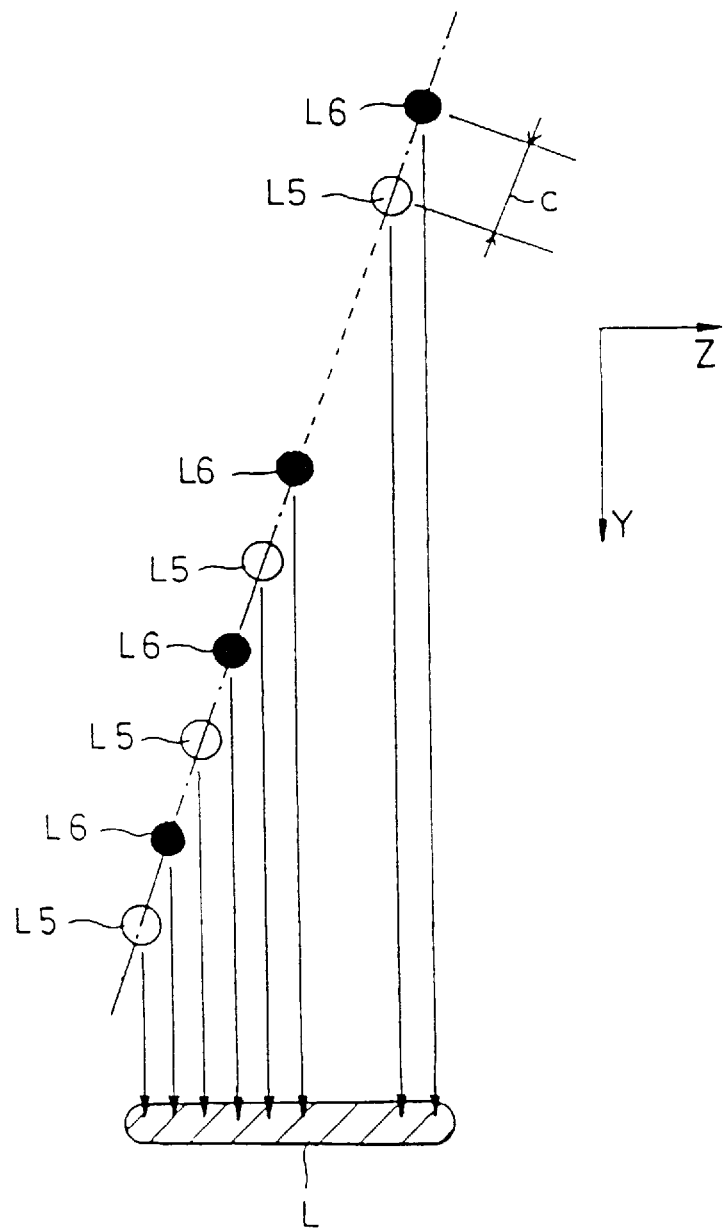
FIG. 25 is an explanatory view of a row of drawing beams and a line drawn by the drawing beams, after an amendment is completed; and, FIGS. 26 and 27 are explanatory views of a drawback which is caused by a polygonal mirror and an fθ lens.

The beam spots(point image) of the first and second drawing beams L5 and L6 which are made incident upon the drawing table surface T at a slightly oblique angle are adjusted through the acoustooptic modulators 36 and 37 each having 8 channels so that the each spot diameter is for example 30 $\mu$m. Consequently, the irregularity in quantity of beam among the beam spots, as shown in FIG. 24 can be eliminated, as can be seen in FIG. 25. In the illustrated embodiment, the pitch of the beam spots, i.e., the distance "P" (FIG. 22) between the adjacent spots is adjusted to be for example 5 $\mu$m through the acoustooptic modulators 36 and 37.

Figure 22:
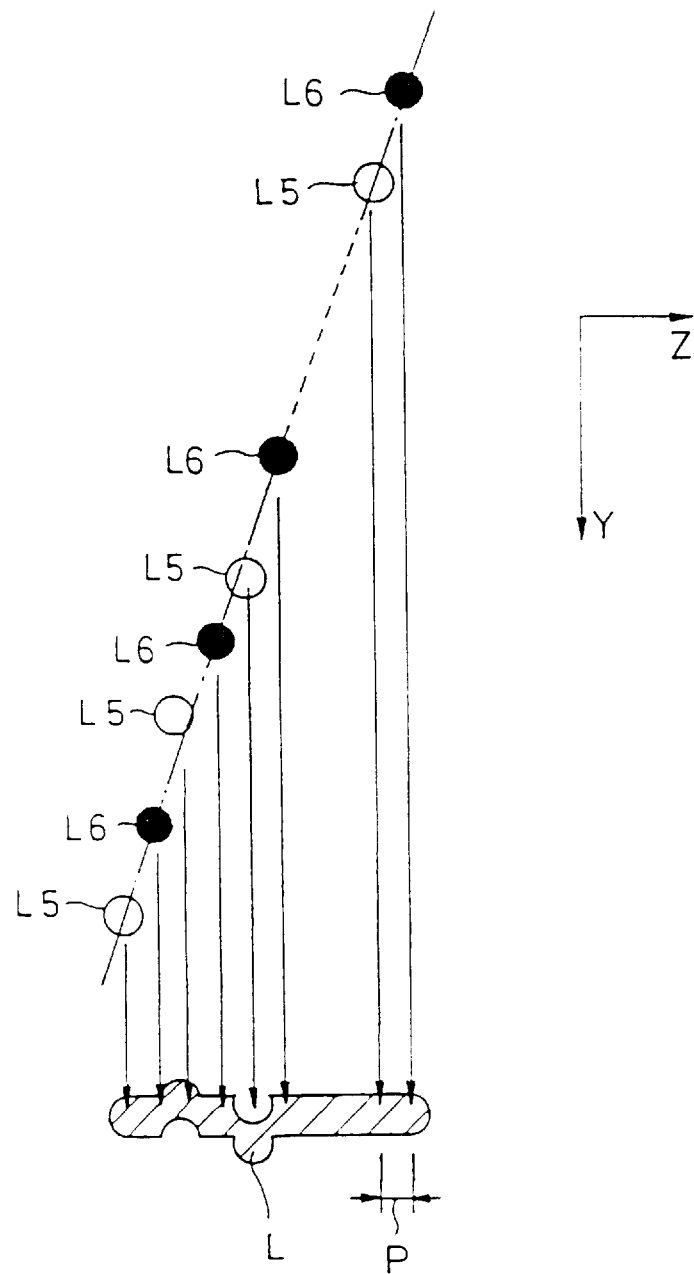
FIG. 22 is an explanatory view of a row of drawing beams and a line drawn by the drawing beams, before an amendment is carried out.
Figure 23:
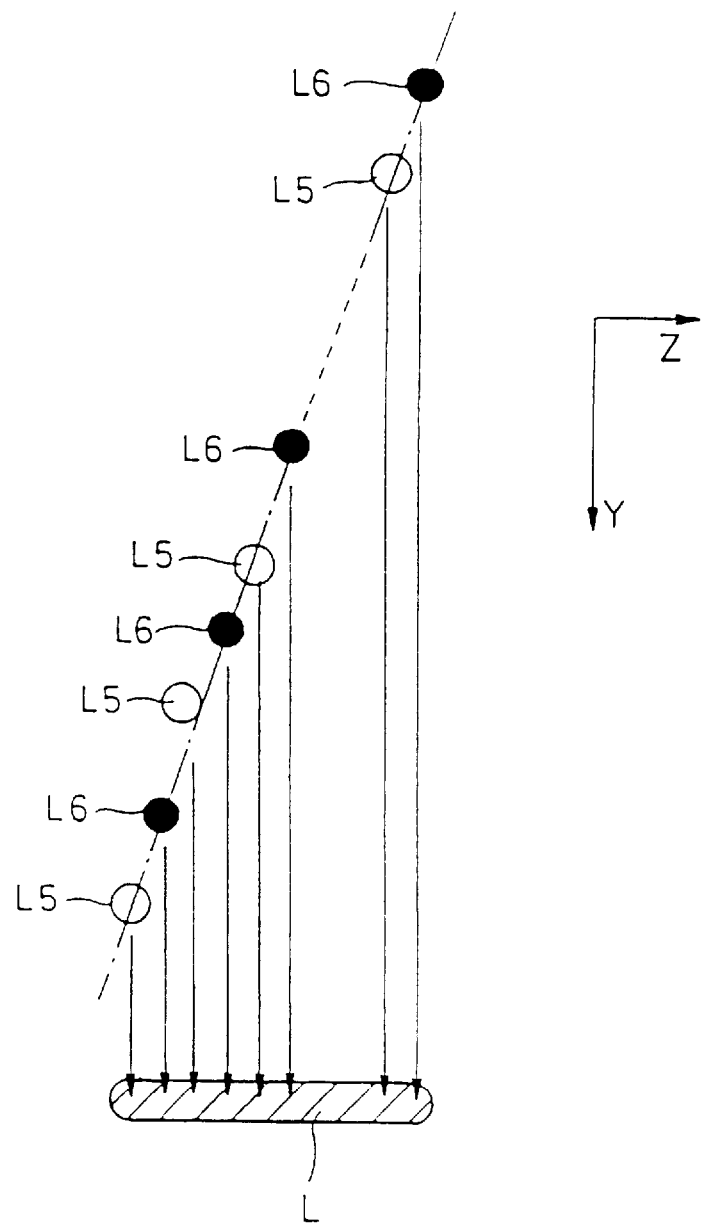
FIG. 23 is an explanatory view of a row of drawing beams and a line drawn by the drawing beams, after an amendment is completed.

The line L (FIGS. 22 through 25) drawn with the beam spots aligned along the sub-scanning direction Z is formed by appropriately turning ON and OFF the acoustooptic modulators 36 and 37. Upon drawing the line L, it is necessary to provide a space "c" (FIG. 25) between the adjacent beam spots of the drawing beams L5 and L6 in order to prevent an interference therebetween. For example, if the exposure by the drawing beam L6 adjacent to the lowermost drawing beam L5 takes place immediately after the completion of the exposure by the lowermost drawing beam L5 in FIG. 25, a straight drawing line L is not obtained. To this end, in the laser drawing apparatus 11 according to the present invention, the control means 8 retards the exposure of the subsequent drawing beam L5 by a predetermined delay time. Consequently, the subsequent beam spot of the second drawing beam L6 can be properly superimposed on the preceding beam spot of the first drawing beam L5 that has been exposed. The straight line L, as shown in FIG. 25, can be formed by repeating the control process as mentioned above. In the control operation, if the line L is not straight due to the irregularity in the position of the beam spots, as shown in FIG. 22, the modulation timing of the acoustooptic modulators 36 and 37 is varied in accordance with the control signal issued from the control means 8 to correct the drawing line L, as shown in FIG. 23.

The laser drawing apparatus 11 according to the present invention operates as follows.

First of all, the substrate S on which the circuit pattern is to be formed is set at an appropriate position in which the positioning hole (not shown) of the substrate is registered with the corresponding portion of the substrate setting apparatus (not shown). When the substrate S is set in the reference position, the substrate S is movable in the direction Z and swingable about the pivot shaft (not shown) by the Z-table and the swing mechanism (not shown) of the substrate setting apparatus.

In this state, the Ar laser 12 is activated to emit the laser beam L1. Consequently, the laser beam L1 is deflected by the beam bender 13; transmitted through the adjusting target 15; and made incident upon the half prism 16 in which the laser beam is split into the drawing beam L2 which runs straight and the drawing beam deflected by 90° toward the half mirror 14. The deflected beam is then split by the half mirror 14 into the drawing beam L3 which is deflected by 90° to run parallel to the second drawing beam L2 and the monitoring beam Lm which is made incident upon the mirror 54 wherein the monitoring beam Lm is deflected by 90°.

The beam L2 is made incident upon the acoustooptic modulator 19 through the lens 65, the adjusting target 17 and the lens 67; and the beam L3 is transmitted through the lenses 66 and 68 and made incident upon the acoustooptic modulator 20. The difference in the quantity of light between the beams L2 and L3 is eliminated by the acoustooptic modulators 19 and 20. The beam L2 and L3 are split into the 8 first drawing beams L5 and the 8 second drawing beams L6 that are in parallel with the first drawing beams L5 in the direction Y by the beam separators 21 and 22, respectively. The first and second drawing beams L5 and L6 are transmitted through the pitch changing convergent optical systems 26 and 27; deflected by 90° through the beam benders 28 and 29; and, made incident upon the acoustooptic modulators 36 and 37 through the pitch changing convergent optical systems 31 and 32, respectively.

The difference in the quantity of light among the 8 beams of the respective first and second drawing beams L5 and L6 is eliminated in accordance with the acoustooptic effect of the acoustooptic modulators 36 and 37 each having 8 channels. The drawing beams L5 and L6 are controlled (turned ON and OFF) by the control means 8 in accordance with the selective application of the high frequency electric field to the acoustooptic modulators 36 and 37.

The first drawing beams L5 emitted from the acoustooptic modulator 36 is deflected by 90° through the beam bender 38 and made incident upon the polarization beam splitter 40. The second drawing beams L6 emitted from the acoustooptic modulator 37 is transmitted through the $\alpha/2$ plate 39 wherein the direction of polarization thereof is changed, and made incident upon the polarization beam splitter 40. The drawing beams L5 and L6, each having 8 beams are successively combined by the polarization beam splitter 40, so that the 16 beams are aligned along one line in the direction Y.

The control means 8 actuates the substrate setting apparatus (not shown) in synchronization with the scanning operation of the drawing beams L5 and L6 by the polygonal mirror 46 to slide the substrate S on the drawing table surface T in the direction Z. Consequently, a two-dimensional predetermined circuit pattern is formed (i.e., drawn or exposed) on the substrate S by the 16 beams of the drawing beams L5 and L6 that are selectively emitted in a slightly oblique direction with respect to the direction Y. The drawing speed is theoretically 16 times the drawing speed at which a circuit pattern is drawn by one drawing beam.

The following adjustment of the drawing beams can be effected prior to the commencement of the drawing operation by the laser drawing apparatus 11. For instance, a detector 9 such as a CCD is set on the drawing table surface T. Similar to the drawing operation of a circuit pattern on the substrate S, the laser beam L1 is emitted from the Ar laser 12, so that the split beams L5 and L6 are made incident upon the detector 9. The micrometer head 84 of the swing adjusting mechanism 79 is actuated while observing the drawn image detected by the detector 9. Consequently, the beam separator 22 is swung about the rotating shaft 83 in the direction A in FIG. 10 to rotate the aligned drawing beams L5, for example, in the direction a in FIG. 19 to thereby adjust the drawing beams L5 to be in parallel with the aligned drawing beams L6. Alternatively, it is possible to swing the beam separator 21 about the rotating shaft 83 to rotate the aligned drawing beams L6 in the direction opposite to the direction α in FIG. 15 to thereby adjust the aligned drawing beams L6 to be parallel with the aligned drawing beams L5.

Figure 17:
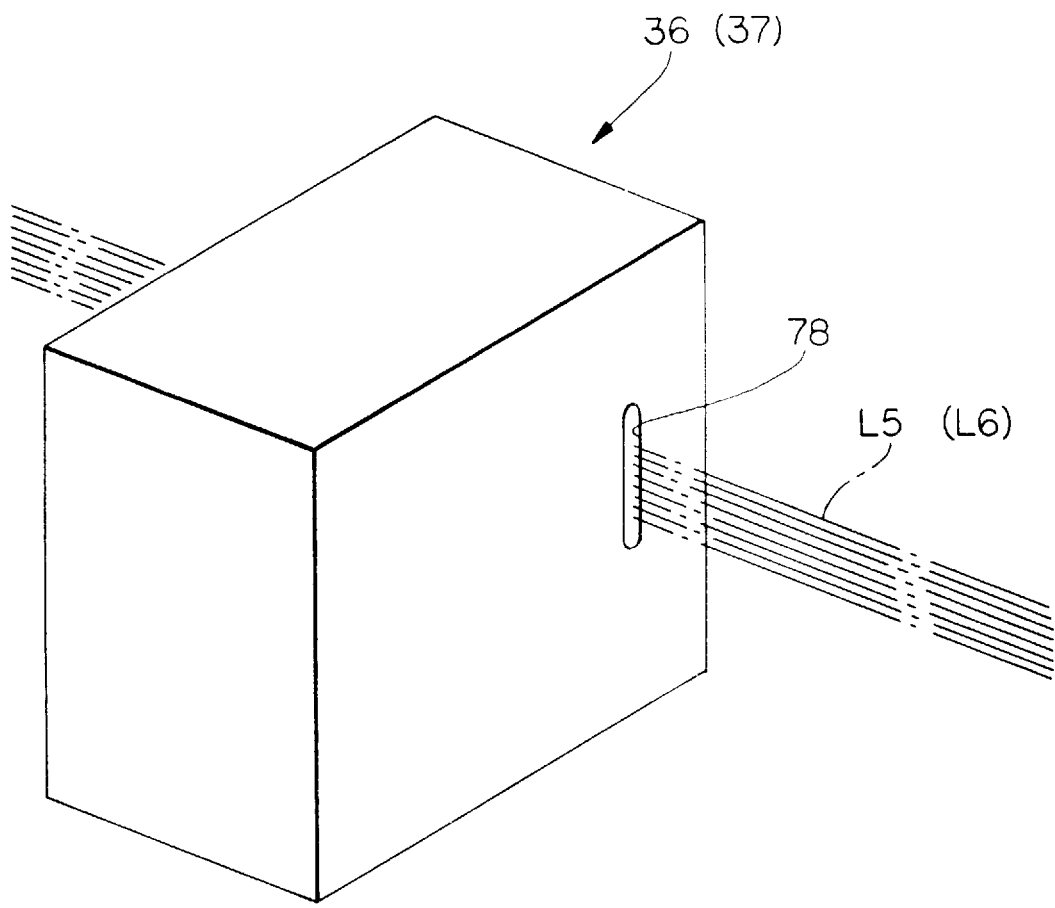
FIG. 17 is a perspective view of an acoustooptic modulator in a laser drawing apparatus shown in FIG. 1.

Thereafter, the Y-direction adjusting mechanism 91 is actuated while observing the drawn image detected by the detector 9. Consequently, the pitch changing convergent optical systems 26 and 31 are appropriately moved in the direction Y (i.e., main scanning direction of the polygonal mirror 46) to move only the drawing beams L5 in the direction Y incident upon the drawing table surface at an oblique incident angle (FIG. 20). Furthermore, the micrometer head 89 of the Y-direction adjusting mechanism 85 is actuated to move the polarization beam splitter 40 in the direction Z to thereby move the drawing beams L5 in the direction Z (i.e., sub-scanning direction of the polygonal mirror 46), whereby the beam spots of the drawing beams L5 and L6 are aligned at a predetermined pitch (FIG. 17). Note that the adjustment by the swing adjusting mechanism 79, the Y-direction adjusting mechanism 91 and the Z-direction adjusting mechanism 85 can be carried out in a sequential order different from that mentioned above.

As can be understood from the foregoing, according to the present invention, a laser drawing apparatus in which the drawing speed can be increased without using an exposing and printing photomask can be obtained. According to the present invention, the image formed by converging the bundles of beams deflected by the deflecting mirror on the drawing surface through the scanning optical system has no or little distortion caused.

Although the invention has been described with reference to particular means, materials and embodiments, it is to be understood that the invention is not limited to the particulars disclosed and extends to all equivalents within the scope of the claims.

I claim:

1. A laser drawing apparatus comprising:

a splitting means comprising a beam splitter which separates laser light emitted from a laser source into two drawing beams, the beams being aligned in a common plane and a beam separator which separates each of the two drawing beams into at least two bundles of drawing beams;

a deflecting mirror having a reflecting surface which reflects and deflects the aligned drawing beams to scan a drawing surface therewith in a main scanning direction; and, a scanning optical system which converges the beams reflected by the reflecting surface of the deflecting mirror onto the drawing surface, wherein the height of the drawing beams on the drawing surface in said main scanning direction from the optical axis of said scanning optical system is limited to be in proportion to a deflection angle θ;

wherein there is the following relationship;

$$\delta = \cos^{-1}\{2 \cos \alpha \cos^2 \omega - \cos \alpha\} \gamma = \tan^{-1}\{\sin \alpha/(2 \cos \alpha \sin \omega \cos \omega)\}(\delta \sin \gamma - \alpha) < p/f$$

wherein

"f" designates the focal length of the scanning optical system;

"α" the incident angle of a drawing beam upon the reflecting surface of the deflecting mirror in a sub-scanning direction normal to said main scanning direction;

"ω" the angle of a line normal to the reflecting surface of the deflecting mirror with respect to a bisector of the optical axis of the scanning optical system and the axis of the incident beam;

"p" the pitch of the aligned drawing beams;

"δ" the angle of the drawing beams reflected by the reflecting surface of the deflecting mirror with respect to the optical axis of the scanning optical system; and, "γ" the angle of a line connecting an image forming point of the drawing beams reflected by the reflecting surface on the drawing surface and an intersecting point on the optical axis of the scanning optical system to the drawing surface, with respect to the sub-scanning direction.

2. The laser drawing apparatus of claim 1, wherein the deflecting mirror is comprised of a rotatable polygonal mirror having a plurality of reflecting surfaces, so that when the polygonal mirror rotates, the drawing surface is scanned with the aligned and split drawing beams reflected by the reflecting surfaces in the main scanning direction of the scanning means.

3. The laser drawing apparatus of claim 2, wherein said angle ω is defined by the rotational angle of the polygonal mirror, and has a reference point defined by a line which is normal to the deflecting surface of a deflecting mirror which bisects the angle β of the optical axis of the scanning optical system and the incident drawing beams.

4. The laser drawing apparatus of claim 2, wherein the polygonal mirror is rotatably supported by a shaft which can be inclined in the sub-scanning direction within a predetermined angular displacement.

5. The laser drawing apparatus of claim 1, wherein the beam separator is supported in such a manner that the beam separator is swingable about an axis extending parallel to the drawing beams in the common plane.

6. The laser drawing apparatus of claim 1, wherein the beam separator is comprised of a plurality of optical elements adhered to each other through separating surfaces, so that the beams incident thereon are split by the successive reflections and transmissions of the beams by and through the beam separator.

7. The laser drawing apparatus of claim 1, wherein the scanning optical system comprises an fθ lens to move the drawing beams at the same drawing speed, wherein the image height of the point image on the drawing surface is in proportion to the deflection angle θ defined by the optical axis thereof and the reflected beams.

8. The laser drawing apparatus of claim 1, further comprising acoustooptic modulators and a control means for controlling the acoustooptic modulators in accordance with predetermined control data, so that the emission of the split drawing beams is independently controlled to provide individual drawing data to the respective drawing beams.

9. The laser drawing apparatus of claim 8, wherein each of the acoustooptic modulators is provided with a plurality of channels which are aligned along a line so as to make the aligned and split drawing beams incident upon the corresponding channels.

10. The drawing apparatus in accordance with claim 1 wherein said light emitted from the laser source is split into eight drawing beams.

11. The drawing apparatus in accordance with claim 1 wherein said light emitted from the laser source is split into sixteen drawing beams.

* * * * *